US009917026B2

(12) United States Patent
Oikawa et al.

(10) Patent No.: US 9,917,026 B2
(45) Date of Patent: Mar. 13, 2018

(54) SEMICONDUCTOR DEVICE

(71) Applicant: Renesas Electronics Corporation, Tokyo (JP)

(72) Inventors: Ryuichi Oikawa, Tokyo (JP); Toshihiko Ochiai, Tokyo (JP); Shuuichi Kariyazaki, Tokyo (JP); Yuji Kayashima, Tokyo (JP); Tsuyoshi Kida, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/515,465

(22) PCT Filed: Dec. 24, 2014

(86) PCT No.: PCT/JP2014/084108
§ 371 (c)(1),
(2) Date: Mar. 29, 2017

(87) PCT Pub. No.: WO2016/103359
PCT Pub. Date: Jun. 30, 2016

(65) Prior Publication Data
US 2017/0213776 A1     Jul. 27, 2017

(51) Int. Cl.
*H01L 23/48*     (2006.01)
*H01L 23/14*     (2006.01)
(Continued)

(52) U.S. Cl.
CPC .......... *H01L 23/147* (2013.01); *H01L 23/498* (2013.01); *H01L 23/49811* (2013.01);
(Continued)

(58) Field of Classification Search
CPC ............. H01L 23/49894; H01L 23/147; H01L 23/498; H01L 23/49811; H01L 23/49844;
(Continued)

(56) References Cited

U.S. PATENT DOCUMENTS 8,653,676 B2   2/2014   Kim et al.
2009/0059641 A1   3/2009   Jeddeloh
(Continued)

FOREIGN PATENT DOCUMENTS

JP   2000-223614 A   8/2000
JP   2006-024734 A   1/2006
(Continued)

OTHER PUBLICATIONS

International Search Report of PCT/JP2014/084108, dated Feb. 24, 2015 (PCT/ISA/210).
(Continued)

*Primary Examiner* — Yosef Gebreyesus
(74) *Attorney, Agent, or Firm* — Sughrue Mion, PLLC

(57) ABSTRACT

A semiconductor device includes first and second semiconductor components mounted on an interposer mounted on a wiring substrate, and electrically connected to each other via the interposer. Also, a plurality of wiring layers of the interposer include first, second and third wiring layers which are stacked in order from a main surface side to be a reference. In addition, in a first region of the interposer sandwiched between the first semiconductor component and the second semiconductor component, a ratio of a reference potential wiring in the third wiring layer is higher than a ratio of a reference potential wiring in the first wiring layer. Further, in the first region, a ratio of a signal wiring in the first wiring layer is higher than a ratio of a signal wiring in the third wiring layer.

20 Claims, 21 Drawing Sheets

(51) Int. Cl.
*H01L 23/498* (2006.01)
*H01L 25/065* (2006.01)
*H01L 23/66* (2006.01)

(52) U.S. Cl.
CPC ........ *H01L 23/49894* (2013.01); *H01L 23/66* (2013.01); *H01L 25/0655* (2013.01); *H01L 2223/6611* (2013.01); *H01L 2223/6638* (2013.01); *H01L 2225/06506* (2013.01); *H01L 2225/06517* (2013.01)

(58) Field of Classification Search
CPC ................. H01L 23/66; H01L 25/0655; H01L 2223/6611; H01L 2223/6638; H01L 2225/06506; H01L 2225/06517
See application file for complete search history.

(56) References Cited

U.S. PATENT DOCUMENTS

| | | | |
|---|---|---|---|
| 2011/0042795 A1 | 2/2011 | Knickerbocker | |
| 2012/0024582 A1* | 2/2012 | Maeda | ............... H01L 21/4857 174/258 |
| 2012/0201087 A1 | 8/2012 | Mizuno et al. | |
| 2012/0235141 A1* | 9/2012 | Masubuchi | .......... H05K 1/0271 257/48 |
| 2013/0137216 A1 | 5/2013 | Ito et al. | |
| 2014/0001639 A1 | 1/2014 | Hiraishi et al. | |
| 2015/0270250 A1 | 9/2015 | Takamitsu | |

FOREIGN PATENT DOCUMENTS

| | | |
|---|---|---|
| JP | 2010-278101 A | 12/2010 |
| JP | 2010-538358 A | 12/2010 |
| JP | 2012-164794 A | 8/2012 |
| JP | 2013-138177 A | 7/2013 |
| JP | 2014-011169 A | 1/2014 |
| JP | 2014-011284 A | 1/2014 |
| WO | 2014/077154 A1 | 5/2014 |

OTHER PUBLICATIONS

Communication dated Nov. 20, 2017, from Japanese Patent Office in counterpart application No. 2016-565722.

* cited by examiner

SEMICONDUCTOR DEVICE

CROSS REFERENCE TO RELATED APPLICATIONS

This application is a National Stage of International Application No. PCT/JP014/084108 filed Dec. 24, 2014, the contents of which are incorporated herein by reference in their entirety.

TECHNICAL FIELD

The present invention relates to a semiconductor device, and relates to, for example, a technique which is effectively applied to a semiconductor device in which a plurality of semiconductor components such as semiconductor chips are electrically connected to each other via an interposer.

BACKGROUND ART

Japanese Patent Application Laid-Open No. 2010-538358 (Patent Document 1), Japanese Patent Application Laid-Open No. 2013-138177 (Patent Document 2), Japanese Patent Application Laid-Open No. 2014-11169 (Patent Document 3), U.S. Pat. No. 8,653,676 (Patent Document 4), and Japanese Patent Application Laid-Open No. 2014-11284 (Patent Document 5) describe semiconductor devices in which a plurality of semiconductor chips are electrically connected to each other via an interposer.

RELATED ART DOCUMENTS

Patent Documents

Patent Document 1: Japanese Patent Application Laid-Open No. 2010-538358
Patent Document 2: Japanese Patent Application Laid-Open No. 2013-138177
Patent Document 3: Japanese Patent Application Laid-Open No. 2014-11169
Patent Document 4: U.S. Pat. No. 8,653,676
Patent Document 5: Japanese Patent Application Laid-Open No. 2014-11284

SUMMARY OF THE INVENTION

Problems to be Solved by the Invention

Techniques for electrically connecting a plurality of semiconductor components to each other via an interposer have been known. In addition, when an interposer is mounted on a wiring substrate serving as a base member of a semiconductor package, it is possible to secure package strength by the wiring substrate, and it is thus possible to improve arrangement density of a plurality of wirings formed in the interposer. Also, when a plurality of wiring layers are provided in the interposer, it is possible to further increase the number of wirings that connect the plurality of semiconductor components to each other. However, it has been found that there is a problem from a viewpoint of reliability of signal transmission in the case where the plurality of wiring layers are provided in the interposer.

For example, there is a case where some of a current flowing in a signal transmission path is consumed by a base member of an interposer depending on a degree of insulation of a member constituting the base member of the interposer with respect to a high frequency signal, thereby causing attenuation of the signal.

Also, when a signal is transmitted between a plurality of semiconductor components via an interposer, for example, it is preferable to shorten the signal transmission path formed in the interposer.

In addition, when a plurality of wiring layers are provided in an interposer, for example, a thickness of each of the wiring layers becomes small. Accordingly, there is a need for a technique of causing an impedance value of the signal transmission path to be a predetermined value continuously. Other problems and novel features will be apparent from description of the present specification and the attached drawings.

Means for Solving the Problems

A semiconductor device according to an embodiment includes first and second semiconductor components which are mounted on an interposer mounted on a wiring substrate and are electrically connected to each other via the interposer. Also, the interposer includes a base member and a plurality of wiring layers arranged on a main surface of the base member. The plurality of wiring layers include a first wiring layer, a second wiring layer spaced farther away from the main surface of the base member than the first wiring layer, and a third wiring layer spaced farther away from the main surface than the second wiring layer. In addition, in a first region of the interposer which is sandwiched between the first semiconductor component and the second semiconductor component and also in plan view, a ratio of a reference potential wiring, which is constituting a part of a transmission path of a reference potential, in the third wiring layer is higher than a ratio of the reference potential wiring in the first wiring layer. Also, in the first region, a ratio of a signal wiring, which is constituting a part of a signal transmission path, in the first wiring layer is higher than a ratio of the signal wiring in the third wiring layer.

Effects of the Invention

According to the embodiment, it is possible to improve reliability of the semiconductor device.

BRIEF DESCRIPTIONS OF THE DRAWINGS

Figure 10:
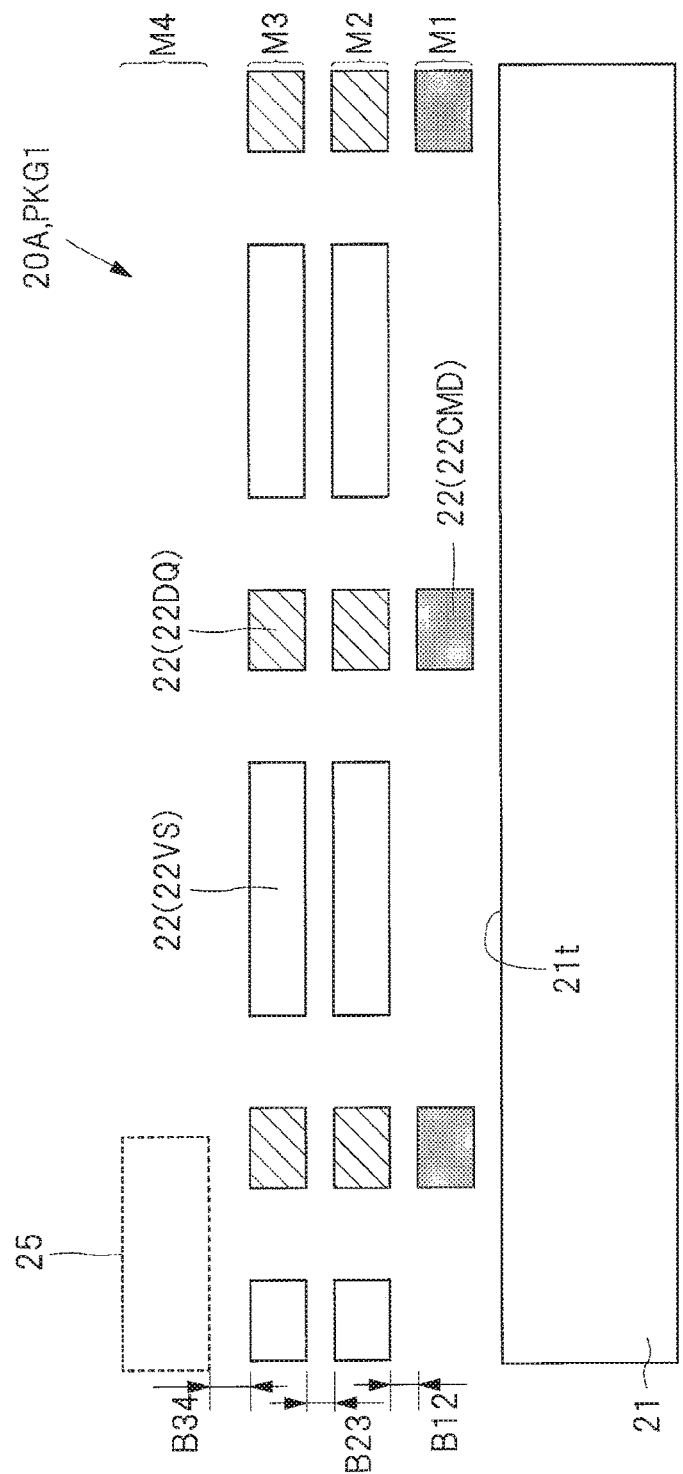
FIG. 10 is a cross-sectional view of a principal part illustrating an example of an arrangement ratio for each type of transmission targets in each wiring layer of an interposer illustrated in FIGS. 5 and 6.
Figure 21:
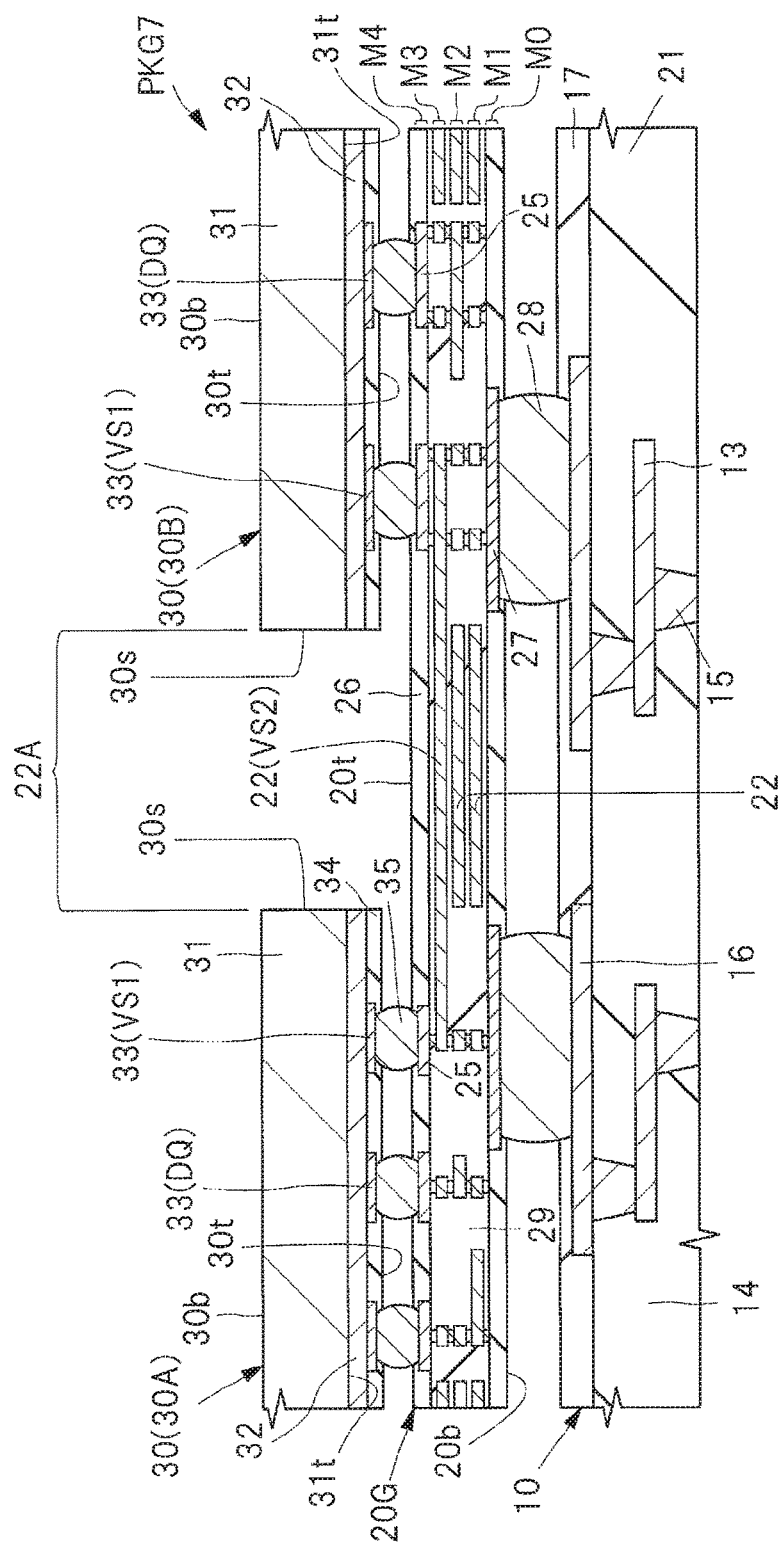
FIG. 21 is an enlarged cross-sectional view of a semiconductor device which is a modification example with respect to FIG. 6.
Figure 22:
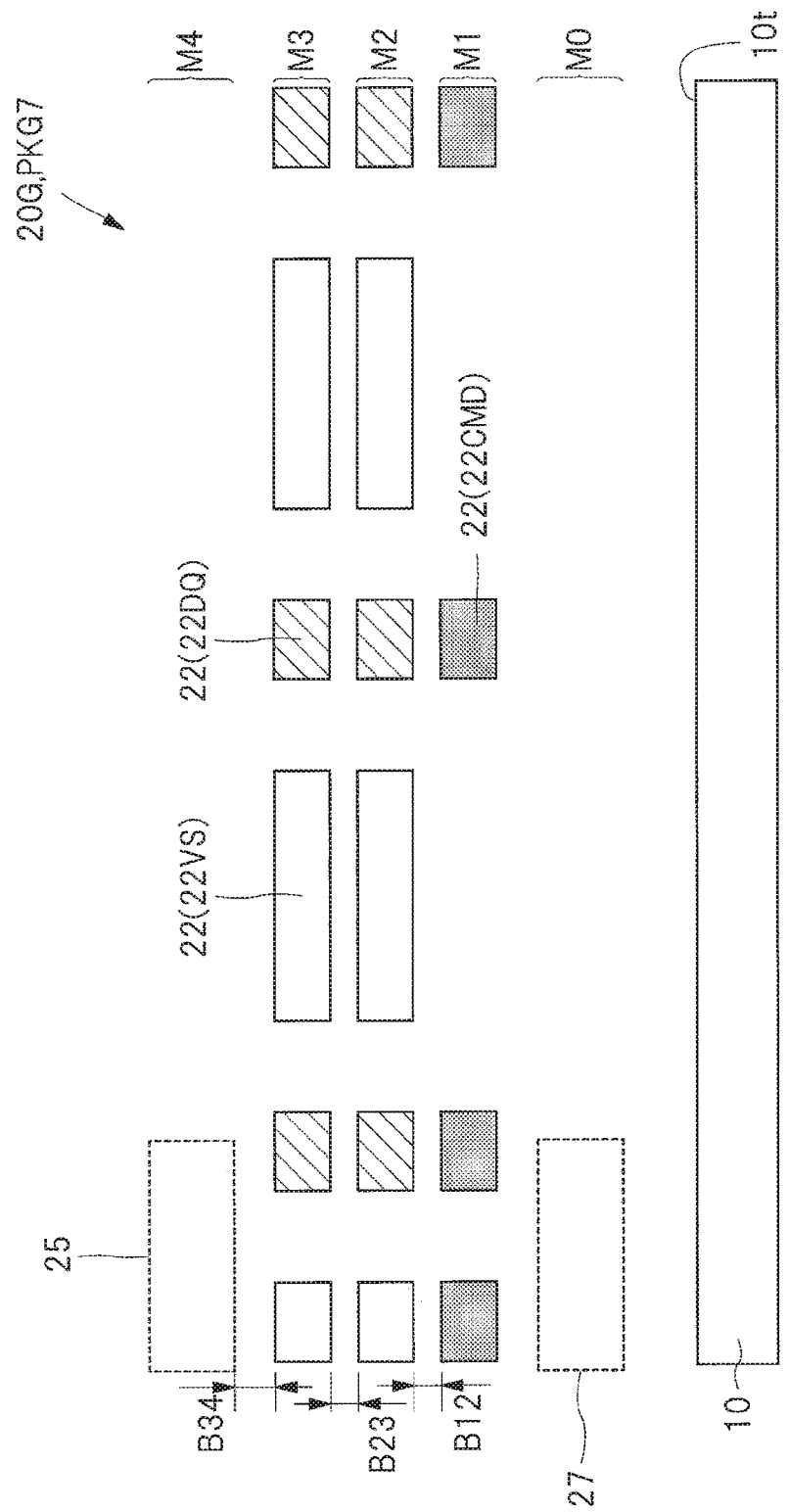
Figure 23:
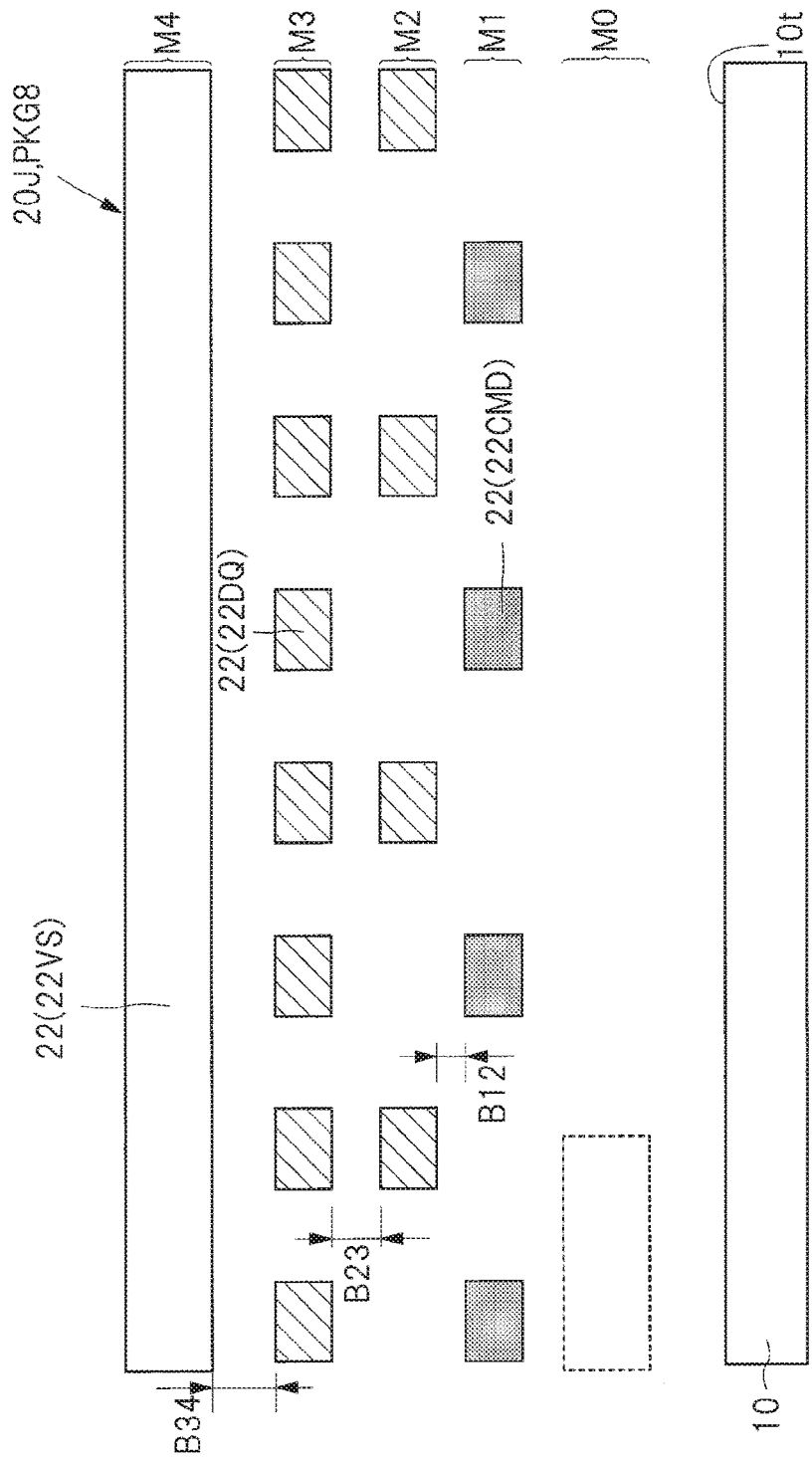

FIG. 22 is a cross-sectional view of a principal part illustrating a modification example with respect to FIG. 10 and an example of an arrangement ratio for each type of transmission targets in each wiring layer of the interposer illustrated in FIG. 21; and FIG. 23 is a cross-sectional view of a principal part illustrating a modification example with respect to FIG. 22 and an example of an arrangement ratio for each type of transmission targets in each wiring layer of an interposer.

DETAILED DESCRIPTIONS OF PREFERRED EMBODIMENTS (Description of Format, Basic Terms, and Usage in the Present Application)

In this application, embodiments will be described in a plurality of sections or the like when required as a matter of convenience. However, these sections are not independent and irrelevant to each other unless otherwise stated, and the one relates to the entire or a part of the other as a detail, a modified example or the like regardless of the order of descriptions. In addition, the description of the same or similar portions is not repeated in principle. Further, the components in the embodiments are not always indispensable unless otherwise stated or except for the case where the components are logically limited to that number and the components are apparently indispensable from the context.

Similarly, in the description of the embodiments, the phrase "X made of A" for a material, a composition or the like is not intended to exclude those containing elements other than A unless otherwise specified or except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise specified clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar components are denoted by the same or similar reference character or reference number, and the descriptions thereof are not repeated in principle.

In addition, in the attached drawings, hatching may be omitted even in cross sections in the case where the hatching makes the drawings complicated on the contrary or discrimination from void is clear. In relation to this, when it is clear from the description or the like, an outline of a background may be omitted even in a planarly closed hole. Furthermore, even in the cases other than the cross section, hatching or dot patterns may be applied so as to clarify a boundary of regions or clarify that a portion is not a vacant space.

(First Embodiment)

In this embodiment, a mode in which a plurality of semiconductor chips are mounted on a so-called silicon interposer in which a plurality of wiring layers are formed on a silicon substrate will be described as an example of a semiconductor device in which a plurality of semiconductor components are electrically connected to each other via an interposer. To be specific, the semiconductor device described as an example in the present embodiment includes a memory chip in which a memory circuit is formed and a logic chip in which a control circuit that controls the memory chip and an arithmetic processing circuit are formed. In addition, the memory chip and the logic chip are electrically connected to each other via a silicon interposer, thereby forming a system inside a single package. The semiconductor device in which the system is formed inside the single package in this manner is referred to as an SiP (System in Package). In addition, a semiconductor device in which a plurality of semiconductor chips are mounted in a single package is referred to as an MCM (Multi Chip Module).

<Overview of Semiconductor Device>

Figure 1:
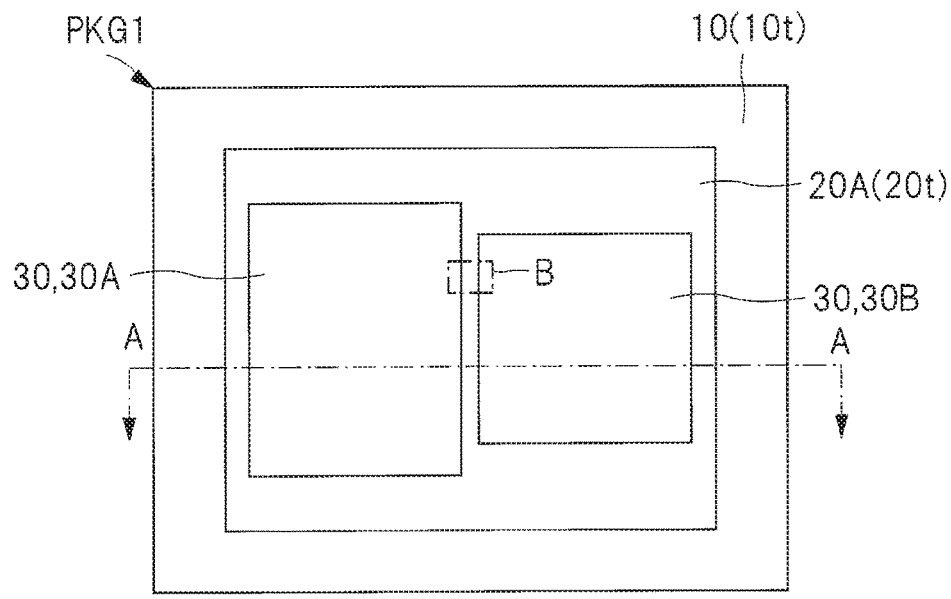
FIG. 1 is a top view of a semiconductor device according to an embodiment.
Figure 2:
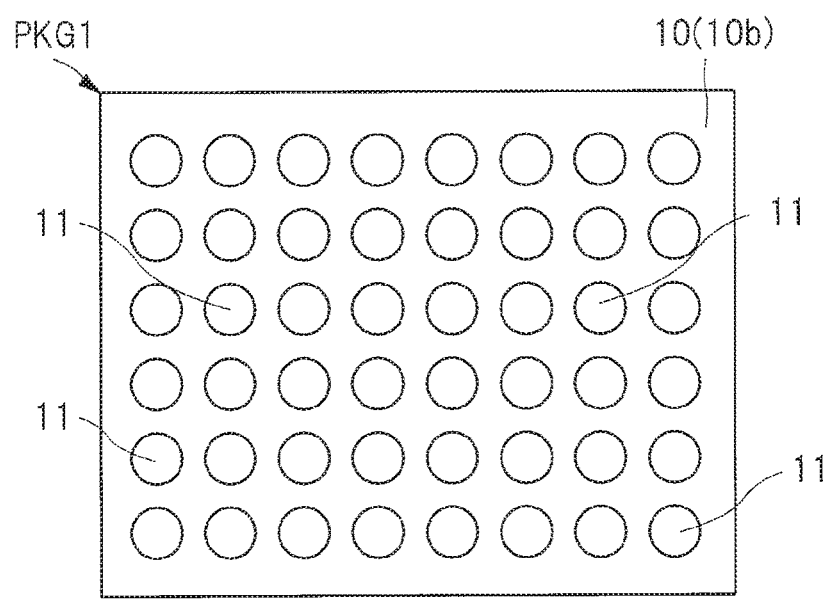
FIG. 2 is a bottom view of the semiconductor device illustrated in FIG. 1.
Figure 3:
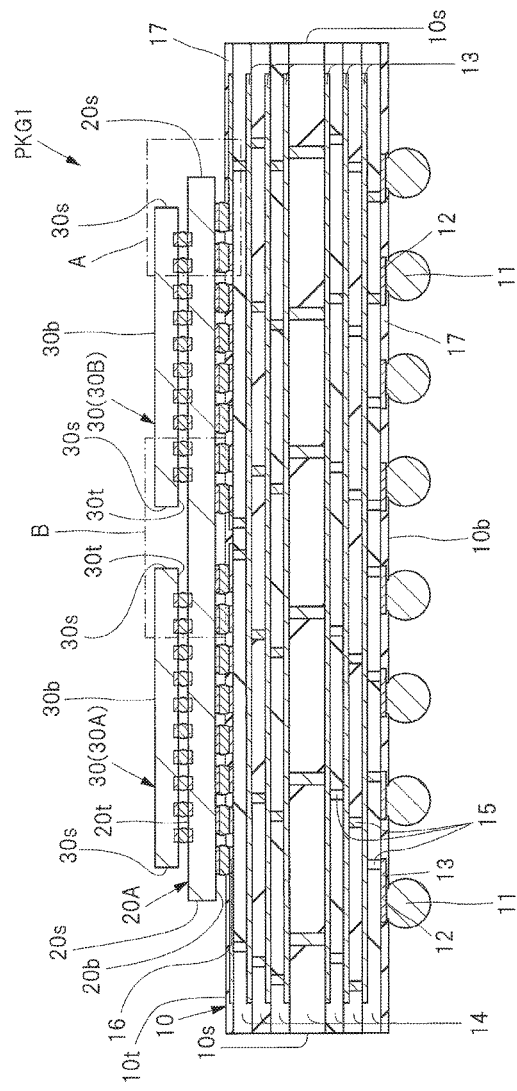
FIG. 3 is a cross-sectional view taken along a line A-A of FIG. 1.
Figure 4:
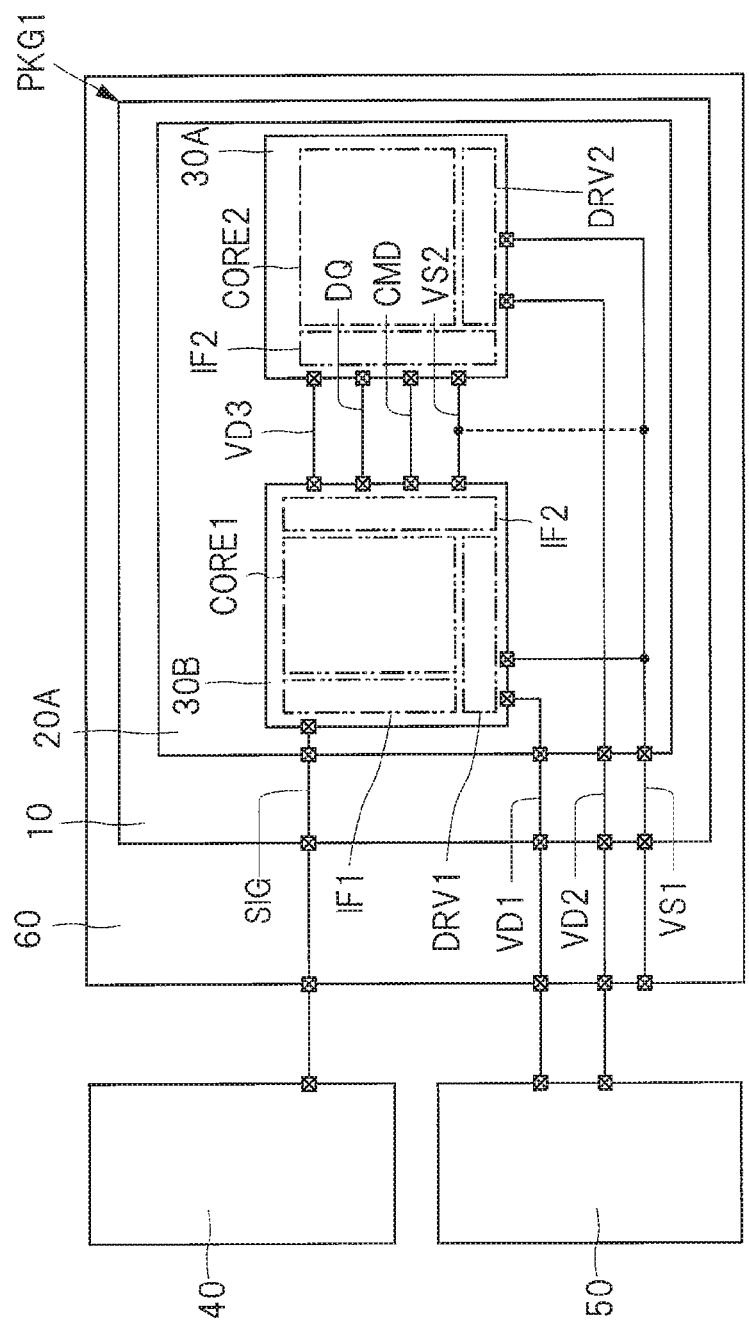
FIG. 4 is an explanatory diagram illustrating a circuit configuration example when the semiconductor device illustrated in FIGS. 1 to 3 is mounted on a mounting substrate.

First, an overview of a structure of the semiconductor device according to the present embodiment will be described with reference to FIGS. 1 to 4. FIG. 1 is a top view of the semiconductor device according to the present embodiment and FIG. 2 is a bottom view of the semiconductor device illustrated in FIG. 1. Also, FIG. 3 is a cross-sectional view taken along a line A-A of FIG. 1. In addition, FIG. 4 is an explanatory diagram illustrating a circuit configuration example when the semiconductor device illustrated in FIGS. 1 to 3 is mounted on a mounting substrate.

Note that FIGS. 2 and 3 illustrate a mode in the case where the number of terminals is small in order to make the drawings easy to see. However, there are various modification examples regarding the number of terminals in addition to the mode illustrated in FIGS. 2 and 3. For example, the number of solder balls 11 illustrated in FIG. 2 may be larger than that illustrated in FIG. 2. Also, one wiring among a plurality of wirings 13 formed in the respective wiring layers is illustrated as an example in FIG. 3 in order to make the drawing easy to see. In addition, in the example illustrated in FIG. 4, a representative transmission path among a large number of transmission paths included in a semiconductor device PKG1 is illustrated as an example.

As illustrated in FIGS. 1 and 3, the semiconductor device PKG1 according to the present embodiment includes a wiring substrate (package substrate) 10, an interposer (relay substrate) 20A mounted on the wiring substrate 10, and a plurality of semiconductor chips 30 mounted on the interposer 20A. The plurality of semiconductor chips 30 are mounted to be arranged on the interposer 20A.

Also, a plurality of solder balls (external terminals, electrodes, external electrodes) 11 as external terminals are arranged on a bottom surface 10b of the wiring substrate 10, which is a mounting surface of the semiconductor device PKG1, in a grid pattern (array form or matrix form) as illustrated in FIG. 2. Each of the plurality of solder balls 11 is connected to a land (external terminal, electrode, external electrode) 12 (see FIG. 3).

A semiconductor device in which the plurality of external terminals (solder balls 11, lands 12) are arranged on the mounting surface in a matrix form like the semiconductor device PKG1 is referred to as an area array semiconductor device. The area array semiconductor device PKG1 can effectively use the mounting surface (bottom surface 10b) of the wiring substrate 10 as an arrangement space of the external terminals, and is thus preferable in terms that it is possible to suppress an increase of a mounting area of the semiconductor device PKG1 even when the number of external terminals is increased. Namely, it is possible to mount the semiconductor device PKG1 whose number of external terminals is increased in accordance with higher functionality and higher integration while saving the space.

Also, the wiring substrate 10 includes atop surface (surface, chip mounting surface) 10t on which the plurality of semiconductor chips 30 are mounted via the interposer 20A, a bottom surface (surface, mounting surface) 10b which is opposite to the top surface 10t, and a side surface 10s which is arranged between the top surface 10t and the bottom surface 10b as illustrated in FIG. 3. In addition, the wiring substrate 10 has a rectangular outer shape in plan view as illustrated in FIG. 1.

Also, the interposer 20A includes atop surface (surface, chip mounting surface) 20t on which the plurality of semiconductor chips (semiconductor components) 30 are mounted, a bottom surface (surface, mounting surface) 20b which is opposite to the top surface 20t, and a side surface 20s which is arranged between the top surface 20t and the bottom surface 20b as illustrated in FIG. 3. In addition, the interposer 20A has a rectangular outer shape in plan view as illustrated in FIG. 1.

In addition, each of the plurality of semiconductor chips 30 includes a front surface (main surface, top surface) 30t, a rear surface (main surface, bottom surface) 30b which is opposite to the front surface 30t, and a side surface 30s which is positioned between the front surface 30t and the rear surface 30b as illustrated in FIG. 3. In addition, each of the plurality of semiconductor chips 30 has a rectangular outer shape in plan view as illustrated in FIG. 1.

In the example illustrated in FIGS. 1 and 3, one of the plurality of semiconductor chips 30 is a memory chip 30A provided with a memory circuit and the other one is a logic chip 30B provided with a control circuit that controls the memory circuit. Also, each of the memory chip 30A and the logic chip 30B is directly connected to the interposer 20A in the example illustrated in FIGS. 1 and 3. In other words, a substrate or another chip component is not inserted between the memory chip 30A and the interposer 20A and between the logic chip 30B and the interposer 20A.

Also, the semiconductor device PKG1 according to the present embodiment is provided with a system which is operated by transmitting signals between the logic chip 30B and the memory chip 30A as illustrated in FIG. 4. The memory chip 30A is provided with a main storage circuit (storage circuit) which stores data for communication with the logic chip 30B. In addition, the logic chip 30B is provided with the control circuit which controls an operation of the main storage circuit of the memory chip 30A. Furthermore, the logic chip 30B is provided with the arithmetic processing circuit which performs arithmetic processing for an input data signal. FIG. 4 illustrates major circuits such as the arithmetic processing circuit and the control circuit as a core circuit (main circuit) CORE1 as an example. Meanwhile, the circuits included in the core circuit CORE1 may include a circuit other than the above-described circuits. For example, an auxiliary storage circuit (storage circuit) having a smaller storage capacity than the main storage circuit of the memory chip 30A such as a cache memory which primarily stores data or the like may be formed in the logic chip 30B.

Also, an external interface circuit (input and output circuit, external input and output circuit) IF1, which performs input and output of a signal from and to an external device 40, is formed in the logic chip 30B. A signal line SIG which transmits a signal between the logic chip 30B and the external device 40 is connected to the external interface circuit IF1. In addition, the external interface circuit IF1 is connected also to the core circuit CORE1, and a signal can be transmitted between the core circuit CORE1 and the external device 40 via the external interface circuit IF1.

In addition, an internal interface circuit (input and output circuit, internal input and output circuit) IF2, which performs input and output of a signal from and to an internal device (for example, the memory chip 30A), is formed in the logic chip 30B. A data line (signal line) DQ which transmits a data signal and a control signal line (signal line) CMD which transmits a control data signal such as an address signal and a command signal are connected to the internal interface circuit IF2. Each of the data line DQ and the control signal line CMD is connected to the internal interface circuit IF2 of the memory chip 30A.

In addition, the logic chip 30B is provided with a power supply circuit DRV1 which supplies a potential for driving the core circuit CORE1 and the input and output circuit. In the example illustrated in FIG. 4, a power supply line VD1 which supplies a power supply potential and a reference potential line VS1 which supplies a reference potential are connected to the power supply circuit DRV1.

Note that FIG. 4 illustrates an example in which a pair of the power supply line VD1 and the reference potential line VS1 is connected to the logic chip 30B, but the potential to be supplied to the logic chip 30B is not limited to the above-described two types. For example, the power supply circuit DRV1 may include an external interface power supply circuit which supplies a voltage for driving the external interface circuit IF1 of the logic chip 30B and a core power supply circuit which supplies a voltage for driving the core circuit CORE1 of the logic chip 30B. In addition, the power supply circuit DRV1 may include an internal interface power supply circuit which supplies a voltage for driving the internal interface circuit IF2 of the logic chip 30B. In this case, a plurality of power supply lines VD1 which supply a plurality of power supply potentials different from each other are connected to the logic chip 30B.

Also, the potential to be supplied to the reference potential line VS1 illustrated in FIG. 4 is a ground potential, for example. However, since the drive voltage is defined depending on a difference between a first potential and a second potential which are different from each other, the potential to be supplied to the reference potential line VS1 may be a potential other than the ground potential.

A chip in which circuits required for an operation of a certain device or system are integrally formed in the single semiconductor chip 30 like the logic chip 30B is referred to as an SoC (System on a Chip). Incidentally, if the main storage circuit illustrated in FIG. 4 is formed in the logic chip 30B, it is possible to form the system in the single logic chip 30B. However, the required capacity of the main storage circuit differs depending on a device or a system to be operated. Thus, by forming the main storage circuit in the semiconductor chip 30 (that is, the memory chip 30A) that is different from the logic chip 30B, the versatility of the logic chip 30B can be improved. Also, by making it possible to connect a plurality of the memory chips 30A depending on the required storage capacity of the main storage circuit, the degree of freedom on the design of the capacity of the storage circuit provided in the system can be improved.

In addition, the memory chip 30A is provided with the main storage circuit in the example illustrated in FIG. 4. FIG. 4 illustrates the main storage circuit as a core circuit (main circuit) CORE2 of the memory chip 30A. Meanwhile, the circuits included in the core circuit CORE2 may include a circuit other than the main storage circuit.

Also, the internal interface circuit (internal input and output circuit) IF2 which performs input and output of a signal from and to an internal device (for example, the logic chip 30B) is formed in the memory chip 30A.

In addition, the memory chip 30A is provided with a power supply circuit (drive circuit) DRV2 which supplies a potential for driving the core circuit CORE2. In the example illustrated in FIG. 4, a power supply line VD2 which supplies a power supply potential and the reference potential line VS1 which supplies the reference potential are connected to the power supply circuit DRV2. In the example illustrated in FIG. 4, each of the power supply potential to be supplied to the power supply line VD1 and the power supply potential to be supplied to the power supply line VD2 is supplied from a power supply 50 provided outside the semiconductor device PKG1.

Note that FIG. 4 illustrates an example in which a pair of the power supply line VD2 and the reference potential line VS1 is connected to the memory chip 30A. In addition, the logic chip 30B and the memory chip 30A are electrically connected via each of a power supply line VD3 which supplies a power supply potential for driving the internal interface circuit IF2 and a reference potential line VS2 in the example illustrated in FIG. 4. However, there are various modification examples regarding a configuration for supplying the potential to the memory chip 30A other than the above-described configuration. For example, the power supply potential for driving the internal interface circuit IF2 of the logic chip 30B and the power supply potential for driving the internal interface circuit IF2 of the memory chip 30A may be supplied independently from each other. In this case, the power supply 50 and the memory chip 30A illustrated in FIG. 4 are electrically connected to each other via the power supply line VD3.

Also, the plurality of transmission paths which electrically connect the logic chip 30B and the memory chip 30A include the reference potential line VS2 in addition to the data line DQ and the control signal line CMD in the example illustrated in FIG. 4. For example, the reference potential line VS2 is formed as a path which transmits a reference signal of the data signal transmitted by the data line DQ. For example, a ground potential is supplied as a reference potential to the reference potential line VS2 for reference. When the ground potential is supplied to each of the reference potential line VS2 and the reference potential line VS1, the potential is stabilized in the case of connecting the reference potential line VS2 and the reference potential line VS1. Accordingly, the reference potential line VS2 and the reference potential line VS1 are preferably connected to each other in the interposer 20A as indicated by a dotted line in FIG. 4. However, a potential other than the ground potential may be supplied to the reference potential line VS2 for reference as long as a variation of the potential in the transmission path can be reduced. For example, a power supply potential of an input and output power supply circuit may be used as the reference potential.

Also, each of the power supply line VD2 for supplying the power supply potential to the memory chip 30A and the reference potential line VS1 for supplying the reference potential to the memory chip 30A is connected to the memory chip 30A without going through the logic chip 30B in the example illustrated in FIG. 4. However, as a modification example with respect to FIG. 4, the power supply line VD1 and the reference potential line VS2 may be connected to the memory chip 30A through the logic chip 30B.

<Configuration of Each Component>

Figure 5:
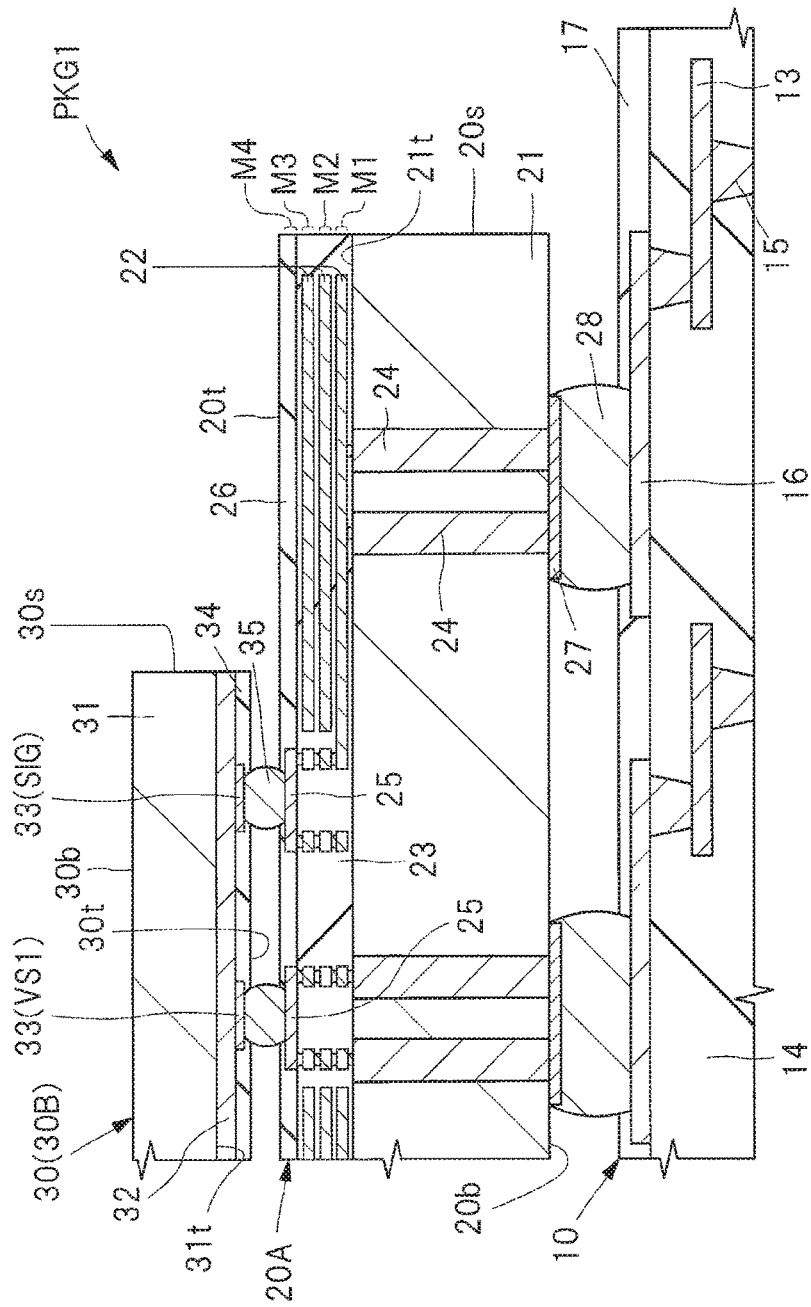
FIG. 5 is an enlarged cross-sectional view of a section A of FIG. 3.
Figure 6:
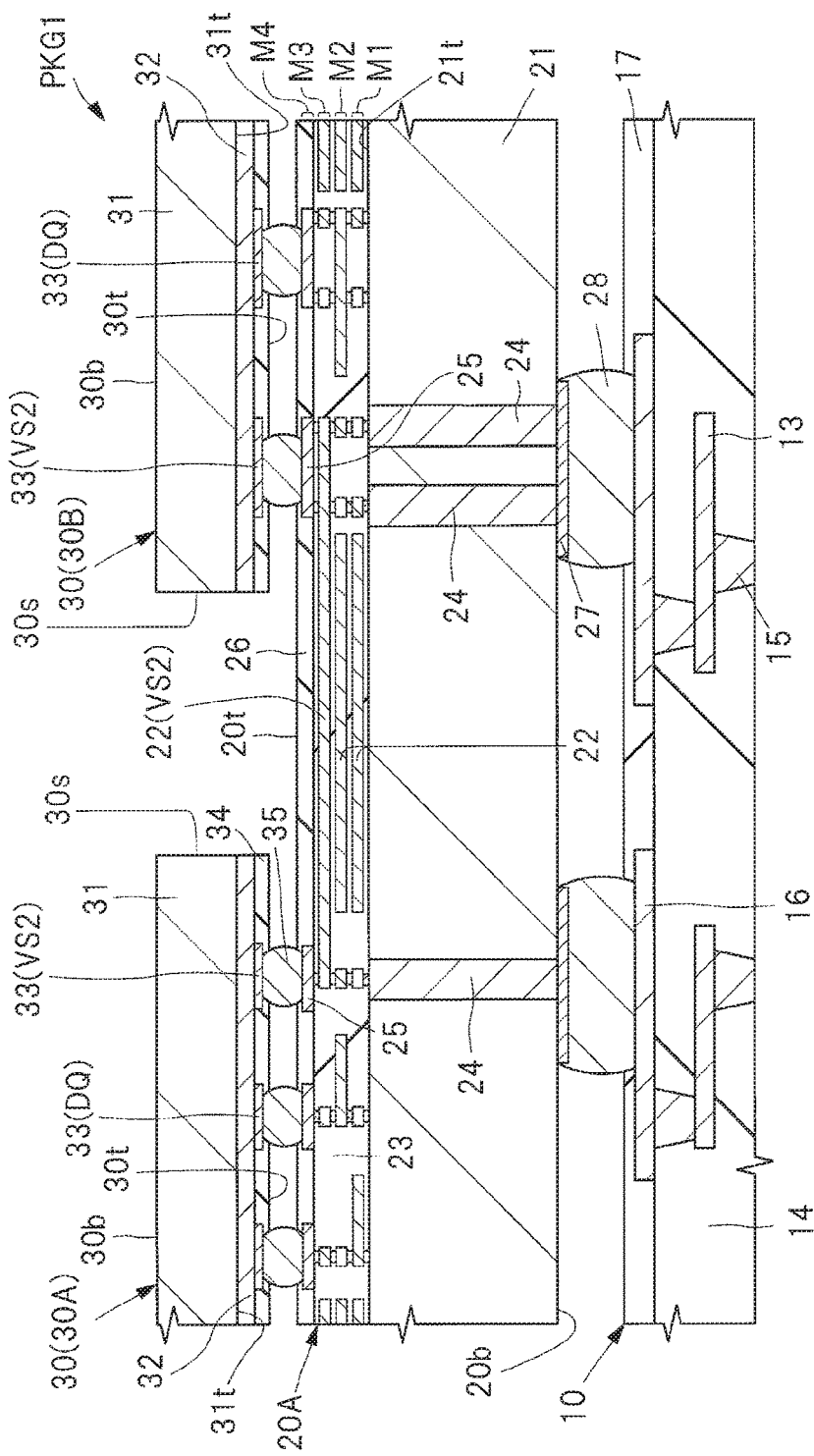
FIG. 6 is an enlarged cross-sectional view of a section B of FIG. 3.

Next, the main components constituting the semiconductor device PKG1 illustrated in FIGS. 1 to 4 will be described in order. FIG. 5 is an enlarged cross-sectional view of a section A of FIG. 3. In addition, FIG. 6 is an enlarged cross-sectional view of a section B of FIG. 3.

The wiring substrate 10 illustrated in FIGS. 1 to 5 is a substrate which is provided with the transmission path that supplies an electrical signal and a potential between the semiconductor device PKG1 and amounting substrate 60 (see FIG. 4). The wiring substrate 10 includes the plurality of wiring layers (eight layers in the example illustrated in FIG. 3) which electrically connect a side of the top surface 10t and a side of the bottom surface 10b. The plurality of wirings 13 provided in the respective wiring layers are covered by insulating layers 14 which insulate the plurality of wirings 13 from each other and the neighboring wiring layers from each other.

The wiring substrate 10 illustrated in FIG. 3 includes the plurality of stacked insulating layers 14, and the insulating layer 14 in the middle thereof is a core layer (core material) obtained by, for example, impregnating a fiber material such as a glass fiber with a resin material such as an epoxy resin. In addition, the insulating layers 14 which are formed on a top surface and a bottom surface of the core layer, respectively, are formed by, for example, the build-up method. However, a so-called coreless substrate which does not include the insulating layer 14 serving as the core layer may be used as a modification example with respect to FIG. 3.

Also, the wiring substrate 10 includes via wirings 15 serving as interlayer conductive paths each of which is provided between the respective wiring layers and connects the stacked wiring layers in a thickness direction. In addition, a plurality of bonding pads (terminals, chip mounting surface terminals, electrodes) 16 are formed on the top surface 10t of the wiring substrate 10. Note that, the wiring 13 provided in the uppermost wiring layer (wiring layer closest to the top surface 10t) among the plurality of wiring layers included in the wiring substrate 10 is formed integrally with the bonding pad 16. In other words, the bonding pad 16 can be considered as a part of the wiring 13. In addition, when the bonding pad 16 and the wiring 13 are considered as separate parts, a part exposed from the insulating film 17 on the top surface 10t of the wiring substrate 10 can be defined as the bonding pad 16, and a part covered by the insulating film 17 can be defined as the wiring 13.

On the other hand, a plurality of lands (terminals, solder connection pads) 12 are formed on the bottom surface 10b of the wiring substrate 10. The solder ball 11 is connected to each of the plurality of lands 12, and the mounting substrate 60 and the semiconductor device PKG1 illustrated in FIG. 4 are electrically connected to each other via the solder balls 11 illustrated in FIG. 3. Namely, the plurality of solder balls 11 function as external connection terminals of the semiconductor device PKG1.

The plurality of solder balls 11 and the plurality of lands 12 are electrically connected to the plurality of bonding pads 16 on a side of the top surface 10t via the plurality of wirings 13 of the wiring substrate 10. Note that the wiring 13 provided in the lowermost wiring layer (wiring layer closest to the bottom surface 10b) among the plurality of wiring layers included in the wiring substrate 10 is formed integrally with the land 12. In other words, the land 12 can be considered as a part of the wiring 13. In addition, when the land 12 and the wiring 13 are considered as separate parts, a part exposed from the insulating film 17 on the bottom surface 10b of the wiring substrate 10 can be defined as the land 12, and a part covered by the insulating film 17 can be defined as the wiring 13.

Also, there is a case where the land 12 itself is configured to function as the external connection terminal as a modification example with respect to FIG. 3. In this case, the solder ball 11 is not connected to the land 12, and each of the plurality of lands 12 is exposed from the insulating film 17 on the bottom surface 10b of the wiring substrate 10. In addition, there is also a case where a thin solder film is connected instead of the solder ball 11 having a ball shape and the solder film is configured to function as the external connection terminal as another modification example with respect to FIG. 3.

Also, the top surface 10t and the bottom surface 10b of the wiring substrate 10 are covered by the insulating film (solder resist film) 17. The wiring 13 formed on the top surface 10t of the wiring substrate 10 is covered by the insulating film 17. An opening is formed in the insulating film 17, and at least a part (bonding region) of the plurality of bonding pads 16 is exposed from the insulating film 17 in this opening. In addition, the wiring 13 formed on the bottom surface 10b of the wiring substrate 10 is covered by the insulating film 17. An opening is formed in the insulating film 17, and at least a part (bonding portion with the solder ball 11) of the plurality of lands 12 is exposed from the insulating film 17 in this opening.

Also, the semiconductor device PKG1 is provided with the interposer 20A which is mounted on the wiring substrate 10 as illustrated in FIG. 5. The interposer 20A is the relay substrate which is interposed between the wiring substrate 10 and the plurality of semiconductor chips 30. In the present embodiment, the interposer 20A includes a silicon substrate (base member) 21 having a main surface 21t and a plurality of wiring layers M1, M2 and M3 arranged on the main surface 21t. When a layer in which a plurality of surface electrodes 25 are formed is regarded as a wiring layer M4 as illustrated in FIG. 5, four wiring layers are stacked in the example illustrated in FIG. 5. A plurality of wirings (conductor patterns) 22 are formed in each of the plurality of wiring layers M1, M2 and M3. The plurality of wirings 22 are covered by an insulating layer 23 which insulates the plurality of wirings 22 from each other and the neighboring wiring layers from each other. The insulating layer 23 is an inorganic insulating layer which is made of, for example, oxide of a semiconductor material such as silicon oxide (SiO).

In addition, the plurality of surface electrodes (electrode pads, terminals) 25 are formed on the wiring layer M3 of the interposer 20A. A part of each of the plurality of surface electrodes 25 is exposed from a passivation film 26 serving as a protective insulating film on the top surface 20t of the interposer 20A. Further, the surface electrode 25 is electrically connected to an electrode (surface electrode, pad) 33 of the semiconductor chip 30 via a bump electrode 35 which is connected to the exposed part of the surface electrode 25.

Also, a plurality of rear surface electrodes (electrodes, pads, terminals) 27 are formed on the bottom surface 20b of the interposer 20A. The plurality of rear surface electrodes 27 are exposed on the bottom surface 20b of the interposer 20A which is positioned on a side opposite to the main surface 21t of the silicon substrate 21. Further, the rear surface electrode 27 is electrically connected to the bonding pad 16 of the wiring substrate 10 via a bump electrode 28 which is connected to the rear surface electrode 27.

In addition, the interposer 20A is provided with a plurality of through electrodes 24 which pass through the silicon substrate 21 in the thickness direction (direction from one surface of the main surface 21t and the bottom surface 20b to the other surface). Each of the plurality of through electrodes 24 is a conductive path which is formed by embedding a conductor such as copper (Cu) or the like in a through hole formed to pass through the silicon substrate 21 in the thickness direction. Each of the plurality of through electrodes 24 has one end connected to the rear surface electrode 27 and the other end connected to the wiring 22 of the wiring layer M1. Namely, the plurality of surface electrodes 25 and the plurality of rear surface electrodes 27 of the interposer 20A are electrically connected to each other via the plurality of wirings 22 and the plurality of through electrodes 24.

The above-described wiring substrate 10 is a support base member of the semiconductor device PKG1. It is preferable to improve rigidity and strength of the wiring substrate 10 in order to demonstrate a function as a support substrate. Thus, the microfabrication of the plurality of wirings 13 to be formed in the wiring substrate 10 is difficult.

Meanwhile, since the interposer 20A is the relay substrate which is mounted on the wiring substrate 10, it does not matter if rigidity and strength of the substrate are lower than those of the wiring substrate 10. Thus, the wiring density of the plurality of wirings 22 formed in the interposer 20A can be improved as compared to that of the wirings 13 of the wiring substrate 10.

In particular, the interposer 20A according to the present embodiment includes the silicon substrate (base member) 21 which is the semiconductor substrate and has a structure in which the plurality of wiring layers M1, M2 and M3 are stacked on the main surface 21t of the silicon substrate 21 as illustrated in FIG. 5. When the plurality of wirings 22 are formed on the semiconductor substrate in this manner, the wiring density can be improved by using the process similar to the process of forming the wirings on a semiconductor wafer.

In the case of using the process of forming the wirings on the semiconductor wafer, a thickness of each of the wiring layers and a distance between the wiring layers are also decreased. For example, the thickness of each of the wiring layers M1, M2 and M3 illustrated in FIGS. 5 and 6, that is, the thickness of each of the plurality of wirings 22 is smaller than the thickness of the wiring 13 of the wiring substrate 10. Since the wiring 13 of the wiring substrate 10 and the wiring 22 of the interposer 20A are illustrated in a single drawing in each of FIGS. 5 and 6, the thickness of the wiring 13 is not more than twice the thickness of the wiring 22. However, the thickness of the wiring 13 is about several to several tens of times as large as the above-described thickness of the wiring 22.

In addition, each of separation distances among the wiring layers M1, M2 and M3 and a separation distance between the main surface 21t of the silicon substrate 21 and the wiring layer M1 are smaller than the thickness of the wiring 22. Each of the separation distances among the wiring layers M1, M2 and M3 and the separation distance between the main surface 21t of the silicon substrate 21 and the wiring layer M1 are about half the thickness of the wiring 22 formed in each of the wiring layers M1, M2 and M3. Note that a separation distance between the wiring layer M4 as the uppermost layer in which the plurality of surface electrodes 25 are formed and the wiring layer M3 is larger than each of the separation distances among the wiring layers M1, M2 and M3. For example, the separation distance between the wiring layer M4 and the wiring layer M3 is almost equal to the thickness of the wiring 22.

As described above, the interposer 20A can improve the wiring density as compared to the wiring substrate 10, and is thus particularly effective in the case of increasing the number of the signal transmission paths connecting the plurality of semiconductor chips 30 to each other. In particular, when the number of the signal transmission paths connecting the logic chip 30B and the memory chip 30A is increased like in the example illustrated in FIG. 4 of the present embodiment, it is possible to reduce the number of the wirings 13 (see FIG. 3) to be formed in the wiring substrate 10 by providing the interposer 20A.

Note that the silicon substrate 21, which is widely used in the manufacturing process of the semiconductor wafer, is used as the base member in the present embodiment. Thus, the silicon substrate 21 illustrated in FIG. 5 is composed mainly of silicon (contains silicon as a major component), which is a semiconductor material. Also, in the semiconductor substrate used for the manufacture of the semiconductor chip, the semiconductor material serving as the base material is generally doped with an impurity element constituting p-type or n-type conductive characteristics. Therefore, when the widely-used semiconductor wafer is used as the silicon substrate 21, the impurity element constituting the p-type or n-type conductive characteristics is doped in the silicon substrate 21.

However, various modification examples can be applied to the silicon substrate 21 according to the present embodiment. For example, a semiconductor material other than silicon may be used as the base material of the semiconductor substrate. In addition, a semiconductor in which the impurity element is not doped in the semiconductor material can also be used as the semiconductor substrate.

In addition, the semiconductor device PKG1 is provided with the plurality of semiconductor chips 30 which are mounted on the top surface 20t of the interposer 20A as illustrated in FIG. 6. Each of the plurality of semiconductor chips 30 includes a silicon substrate (base member) 31 having a main surface 31t and a wiring layer 32 formed on the main surface 31t. Note that FIGS. 5 and 6 illustrate the single wiring layer 32 in order to make the drawings easy to see. However, a plurality of wiring layers each of which has a smaller thickness than each of the wiring layers M1, M2 and M3 of the interposer 20A are stacked in the wiring layer 32 illustrated in FIGS. 5 and 6, for example. In addition, although not illustrated in order to make the drawings easy to see, a plurality of wirings are formed in each of the plurality of wiring layers 32. Further, the plurality of wirings are covered by an insulating layer which insulates the plurality of wirings from each other and the neighboring wiring layers from each other. The insulating layer is an inorganic insulating layer which is made of, for example, oxide of a semiconductor material such as silicon oxide (SiO).

In addition, a plurality of semiconductor elements, for example, transistor elements or diode elements are formed on the main surface 31t of the silicon substrate 31 provided in each of the plurality of semiconductor chips 30. The plurality of semiconductor elements are electrically connected to the plurality of electrodes 33 formed on the side of the front surface 30t via the plurality of wirings of the wiring layer 32.

Also, each of the plurality of semiconductor chips 30 is mounted on the top surface 20t of the interposer 20A in a state where the front surface 30t and the top surface 20t of the interposer 20A face each other in the present embodiment. The mounting method like this is referred to as a face-down mounting method or a flip-chip connection method. In the flip-chip connection method, the semiconductor chip 30 and the interposer 20A are electrically connected to each other in the following manner.

The plurality of electrodes (surface electrodes, pads, terminals) 33 are formed on the wiring layer 32 of the semiconductor chip 30. A part of each of the plurality of electrodes 33 is exposed from a passivation film 34 serving as a protective insulating film on the front surface 30t of the semiconductor chip 30. Further, the electrode 33 is electrically connected to the surface electrode 25 of the interposer 20A via the bump electrode 35 which is connected to the exposed part of the electrode 33.

In addition, some of the plurality of transmission paths connected to the memory chip 30A are not connected to the wiring substrate 10, but are connected to the logic chip 30B via the interposer 20A in the present embodiment as illustrated in FIG. 4. In the example illustrated in FIG. 4, the data line DQ and the control signal line CMD are electrically isolated from the wiring substrate 10. Meanwhile, the power supply line VD2, which supplies the power supply potential for driving the circuit of the memory chip 30A, and the reference potential line VS1 among the plurality of transmission paths connected to the memory chip 30A are electrically connected to the wiring substrate 10. Note that the reference potential line VS2 used for the reference of the signal line among the transmission paths that electrically connect the logic chip 30B and the memory chip 30A may be isolated from the wiring substrate 10.

<Details of Transmission Paths that Electrically Connect Semiconductor Chips to Each Other>

Next, details of the signal transmission paths that electrically connect the logic chip 30B and the memory chip 30A as illustrated in FIG. 4 will be described.

As a representative example of the SiP type semiconductor device, there is a configuration in which the logic chip 30B and the memory chip 30A are mounted inside the single package like in the present embodiment. In order to improve the performance of the SiP type semiconductor device having such a configuration, a technique of improving the transmission speed of the signal transmission paths that connect the logic chip 30B and the memory chip 30A is necessary. For example, each of the plurality of data lines DQ among the signal transmission paths illustrated in FIG. 4 is designed to transmit the data signal at the transmission speed of 1 Gbps (1 Gigabit per second) or higher. It is necessary to increase the number of times of transmission per unit time (hereinafter, described as clock increase) in order to increase the transmission speed of each of the plurality of signal transmission paths.

In addition, as another method of improving the signal transmission speed between the logic chip 30B and the memory chip 30A, there is a method of increasing the data amount to be transmitted per one transmission by increasing a width of a data bus of the internal interface (hereinafter, described as bus width expansion). In addition, there is a method of applying the above-described bus width expansion and clock increase in combination. In this case, a large number of high-speed signal transmission paths are necessary. Accordingly, the method of electrically connecting the logic chip 30B and the memory chip 30A via the interposer 20A like in the present embodiment is effective.

For example, the memory chip 30A illustrated in FIG. 4 is a so-called wide I/O memory having a data bus width of 512 bit or higher. To be specific, the memory chip 30A is provided with, for example, four channels each having a data bus width of 128 bit, and a total bus width of the four channels is 512 bit. In addition, the number of times of transmission of each channel per unit time is subjected to the clock increase, and each becomes, for example, 1 Gbps or higher.

However, the inventors of the present invention have found that there is a problem from the viewpoint of the reliability of signal transmission as a result of the study regarding the configuration in which the logic chip 30B and the memory chip 30A are electrically connected to each other via the interposer including the plurality of wiring layers.

First, it has been found that there is a case where some of energy of a signal is converted into heat energy and is consumed and a transmission loss (hereinafter, referred to as a signal loss) is caused when the high-speed signal transmission is performed on the interposer including the silicon substrate according to the study of the inventors of the present invention. At this time, it has also been found that a degree of the signal loss is small in a state where a frequency of the signal is low, but the degree of the signal loss rapidly increases as the frequency of the signal becomes higher as illustrated in FIG. 7.

Figure 7:
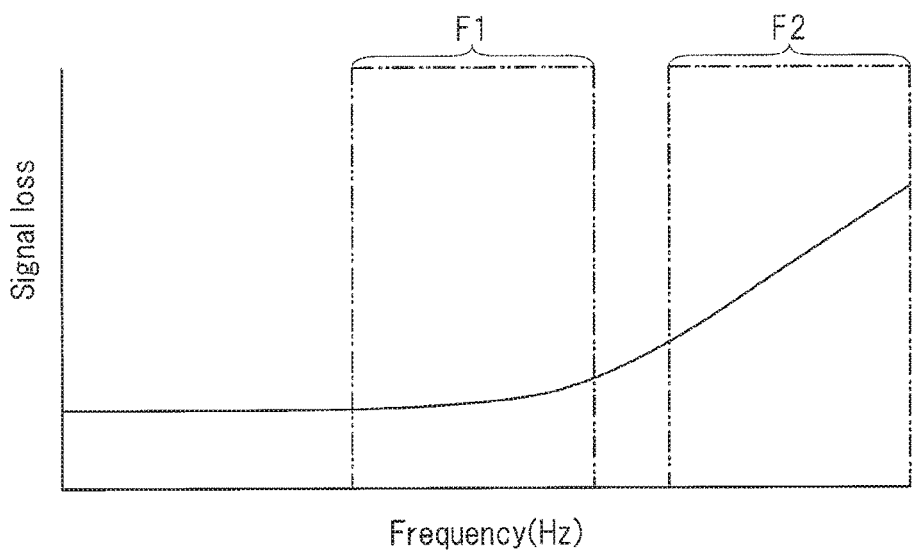
FIG. 7 is an explanatory diagram illustrating a relationship between an operational frequency of a signal transmission path and a signal loss.
Figure 8:
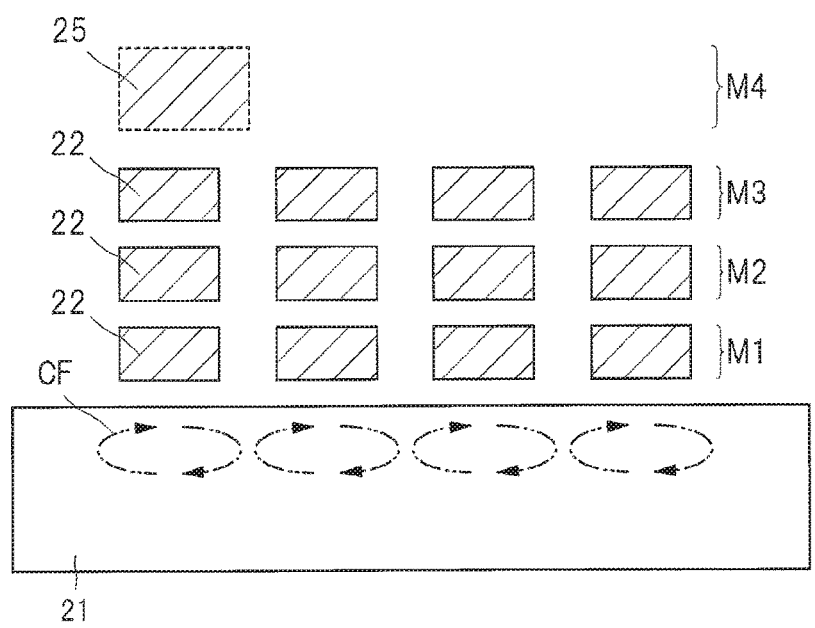
FIG. 8 is a cross-sectional view of a principal part schematically illustrating a state in which a current flows in a silicon substrate.

FIG. 7 is an explanatory diagram illustrating a relationship between an operational frequency of the signal transmission path and the signal loss. In addition, FIG. 8 is a cross-sectional view of a principal part schematically illustrating a state in which the current flows in the silicon substrate. In FIG. 7, a frequency at which the signal transmission is performed is represented in logarithm on the horizontal axis, and the degree of the signal loss in each frequency is represented on the vertical axis. In addition, an operational frequency band of the data line DQ illustrated in FIG. 4 is indicated as a frequency band F2, and an operational frequency band of the control signal line CMD is indicated as a frequency band F1 in FIG. 7. Also, the surface electrode 25 is indicated by a dotted line in FIG. 8 in order to clearly illustrate that the wiring layer M4 is a layer configured to form the surface electrode 25.

Here, a behavior in the case where the signal current flows in the wiring 22 illustrated in FIG. 8 will be studied. The silicon substrate 21 illustrated in FIG. 8 contains an impurity element constituting p-type or n-type conductive characteristics like the silicon substrate 21 included in the interposer 20A according to the present embodiment illustrated in FIG. 5.

When a signal current flows in the wiring 22 illustrated in FIG. 8, an electromagnetic field is generated around the wiring 22. When the frequency of the signal current flowing in the wiring 22 is low, a current CF illustrated in FIG. 8 hardly flows in the silicon substrate 21. Thus, for example, in the case of transmitting the signal current at the frequency band F1 illustrated in FIG. 7, the degree of the signal loss is hardly changed even when the frequency is changed.

However, it has been found that the current CF is likely to flow in the silicon substrate 21 illustrated in FIG. 8 when the signal current is transmitted at a high frequency such as the frequency band F2 illustrated in FIG. 7 according to the study of the inventors of the present invention. In addition, since the silicon substrate acquires the conductivity by doping the impurity in the semiconductor material as the base material, a resistance value when the current CF flows in the silicon substrate 21 is larger as compared to that of a conductor such as the wiring 22. Thus, the electric energy (electromagnetic field and the current CF generated along with the electromagnetic field) generated when the current CF flows is converted into the heat energy and is consumed. As a result, the current value of the signal current flowing in the wiring 22 decreases. Namely, the signal loss is caused in the signal transmission path. According to the study of the inventors of the present invention, the degree of the signal loss rapidly increases when the operational frequency of the signal transmission path becomes 1 GHz (gigahertz) or higher.

Accordingly, it is preferable to implement a countermeasure to suppress the increase of the signal loss in the frequency band F2 at which the degree of the signal loss increases from a viewpoint of improving the reliability of the signal transmission. According to the present embodiment, it is possible to suppress the increase of the signal loss described above. Hereinafter, reasons therefor will be described in order.

Figure 9:
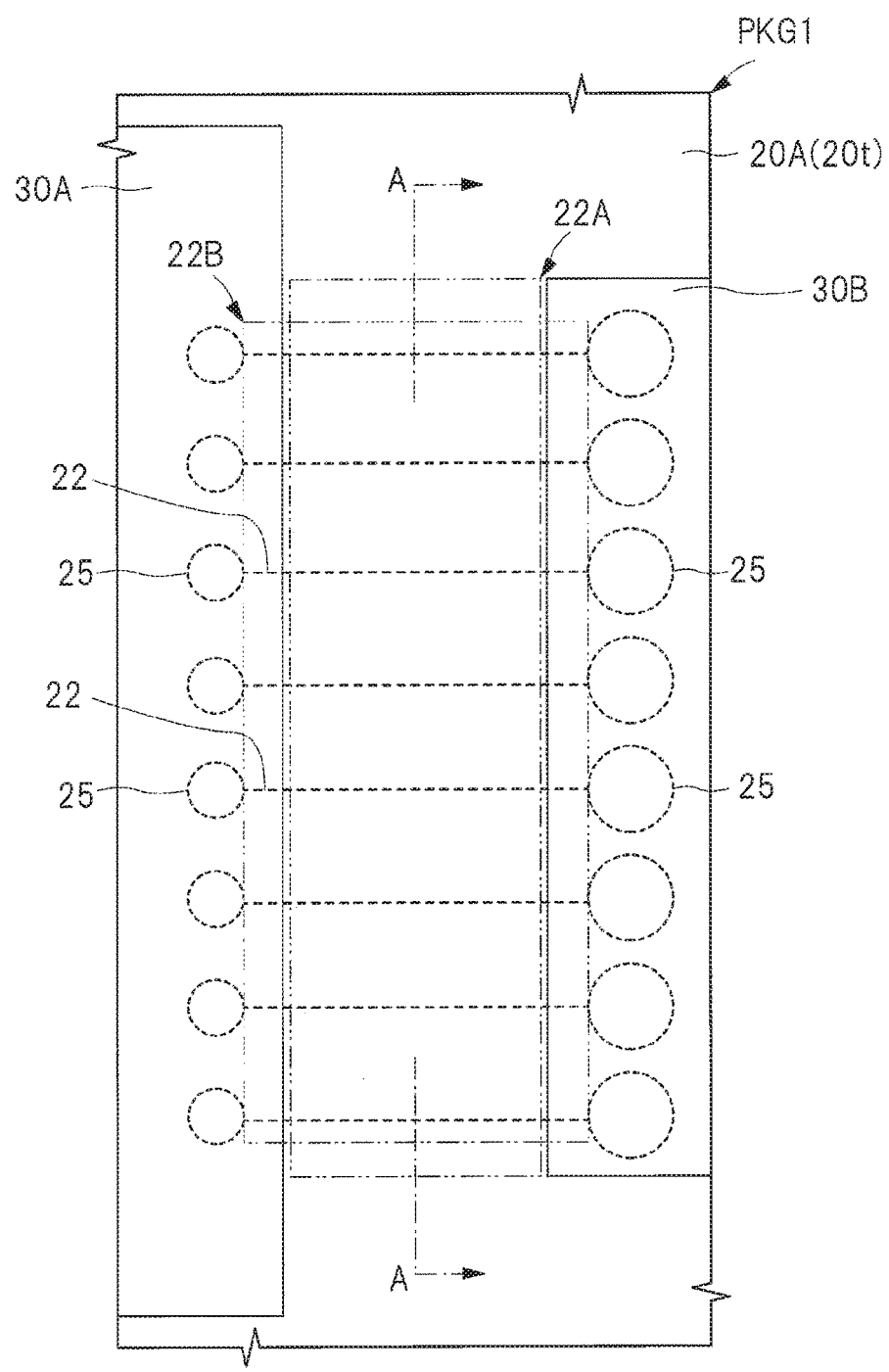
FIG. 9 is an enlarged plan view illustrating a periphery of a region between a logic chip and a memory chip illustrated in FIG. 1 in an enlarged manner.

FIG. 9 is an enlarged plan view illustrating a periphery of a region between the logic chip and the memory chip illustrated in FIG. 1 in an enlarged manner. Also, FIG. 10 is a cross-sectional view of a principal part illustrating an arrangement example of the wirings for each type of transmission targets in a cross section taken along a line A-A of FIG. 9. In FIG. 9, the plurality of wirings 22 electrically connecting the memory chip 30A and the logic chip 30B and the plurality of surface electrodes 25 of the interposer 20A connected to both ends of the wirings 22 are indicated by dotted lines. FIG. 9 schematically illustrates the electrical connection between the memory chip 30A and the logic chip 30B via the plurality of wirings 22, and the number of the wirings 22 and the surface electrodes 25 and each position thereof are not limited to the mode illustrated in FIG. 9. Also, in FIG. 9, a peripheral edge portion of a region 22A sandwiched between the neighboring semiconductor chips and a peripheral edge portion of a region 22B in which the plurality of wirings 22 electrically connecting the neighboring semiconductor chips to each other are formed are indicated by two-dot chain lines. In addition, since the region 22A and the region 22B overlap each other, a pattern is attached to the region 22A in order to make the drawing easy to see. Further, although FIG. 10 is a cross-sectional view, different patterns are attached depending on the types of transmission targets in order to identify the type of the transmission paths constituted of the plurality of wirings 22. To be specific, line hatching is attached to a data signal wiring 22DQ constituting a part of the data line DQ illustrated in FIG. 4, and dot pattern is attached to a control signal wiring 22CMD constituting a part of the control signal line CMD illustrated in FIG. 4. Also, a reference potential wiring 22VS serving as a transmission path of a reference potential is shown as a blank without attaching any pattern thereto. In addition, the silicon substrate 21 is also shown as a blank without attaching any pattern thereto. Further, the surface electrode 25 is indicated by a dotted line in FIG. 10 in order to clearly illustrate that the wiring layer M4 is the layer configured to form the surface electrode 25.

First, a region in which the wiring structure needs to be studied from a viewpoint of improving the reliability of the signal transmission between the neighboring semiconductor chips will be described. As illustrated in FIG. 9, the memory chip 30A and the logic chip 30B included in the semiconductor device PKG1 according to the present embodiment are electrically connected to each other via the plurality of wirings 22 of the interposer 20A. Also, it is preferable to shorten the signal transmission path in the case of performing the high-speed signal transmission. Accordingly, the wiring 22 electrically connecting the memory chip 30A and the logic chip 30B is mainly arranged in the region 22A of the interposer 20A sandwiched between the memory chip 30A and the logic chip 30B in plan view. Thus, it is only required to study the wiring structure in the region 22A illustrated in FIG. 9 in the case of studying electrical characteristics of the wiring 22, and wiring structures of other regions are not particularly limited.

Note that the region in which the plurality of wirings 22 which electrically connect the memory chip 30A and the logic chip 30B are connected is strictly the region 22B between the plurality of surface electrodes 25 which are connected to both ends of the plurality of wirings 22 as illustrated in FIG. 9. However, each of the plurality of surface electrodes 25 connected to both ends of the plurality of wirings 22 is formed to be close to the opposing sides of the neighboring semiconductor chips in order to shorten the signal transmission path. In this case, most of the region 22B overlaps the region 22A as illustrated in FIG. 9. Accordingly, it is possible to improve the reliability of the signal transmission between the neighboring semiconductor chips at least by improving the wiring structure in the region 22A. However, for example, when a length of the wiring 22 connecting the neighboring semiconductor chips to each other is long and each of the plurality of surface electrodes 25 is spaced from the opposing sides of the neighboring semiconductor chips, it may be preferable to consider a wiring structure in the region 22B.

Hereinafter, the wiring structure in the region 22A illustrated in FIG. 9 will be described. However, the wiring structure to be described hereinafter can be applied also to the case of considering the wiring structure in the region 22B.

As illustrated in FIG. 10, the interposer 20A provided in the semiconductor device PKG1 according to the present embodiment includes the wiring layer M1, the wiring layer M2 spaced farther away from the main surface 21t of the silicon substrate 21 than the wiring layer M1, and the wiring layer M3 spaced farther away from the main surface 21t than the wiring layer M2.

Also, in the region 22A (see FIG. 9), a ratio (occupancy rate) of the reference potential wiring 22VS, which is constituting a part of the transmission path of the reference potential, in the plurality of wirings 22 in the wiring layer M3 is higher than a ratio (occupancy rate) of the reference potential wiring 22VS in the wiring layer M1. The above-described ratio of the reference potential wiring 22VS in the wiring layer M1 (or the wiring layer M3) means an occupancy rate of the reference potential wiring 22VS relative to a total value of a plane area of the conductor pattern formed in the wiring layer M1 (or the wiring layer M3). In addition, the ratio of the signal wiring in the wiring layer M1 (or the wiring layer M3) means an occupancy rate of the signal wiring relative to the total value of the plane area of the conductor pattern formed in the wiring layer M1 (or the wiring layer M3). Hereinafter, in this specification, the same meaning described above is applied in the case of describing a ratio of a certain type of a wiring in a certain wiring layer except for the case of particularly describing that the term is used in different meaning.

In addition, in the region 22A (see FIG. 9), the ratio (occupancy rate) of the signal wirings (data signal wiring 22DQ and control signal wiring 22CMD), which is constituting a part of the signal transmission path in the plurality of wirings 22 in the wiring layer M1 is higher than the ratio (occupancy rate) of the signal wiring in the wiring layer M3.

The configuration of the interposer 20A according to the present embodiment can be expressed as follows. That is, the signal wiring (data signal wiring 22DQ or control signal wiring 22CMD) is mainly provided in the wiring layer M1 with a relatively close distance to the main surface 21t of the silicon substrate 21, and the reference potential wiring 22VS is mainly provided in the wiring layer M3 with a relatively far distance to the main surface 21t of the silicon substrate 21. Accordingly, the following effects are obtained.

That is, it is possible to control the distribution of an electromagnetic field generated when the signal flows in the wiring 22 by using the reference potential wiring 22VS. When the area of the reference potential wiring 22VS provided below the wiring 22 in which the signal current flows is small and the area of the reference potential wiring 22VS provided above the wiring 22 is large, the electromagnetic field is distributed mainly in the same layer as the wiring 22 or above the wiring 22. Thus, it is possible to suppress the signal loss caused by the flowing of the current CF (see FIG. 8) in the silicon substrate 21 even when the signal current flowing in the wiring 22 is a high frequency signal.

Note that the reference potential to be supplied to the reference potential wiring 22VS illustrated in FIG. 10 is the same potential as the potential (for example, the ground potential) to be supplied to the reference potential line VS1 illustrated in FIG. 4, for example. Also, the distribution of the electromagnetic field generated when the signal flows in the wiring 22 may be controlled by using the transmission path to which a potential other than the ground potential is supplied. For example, the power supply potential supplied for driving the input and output circuit illustrated in FIG. 4 may be used.

Figure 11:
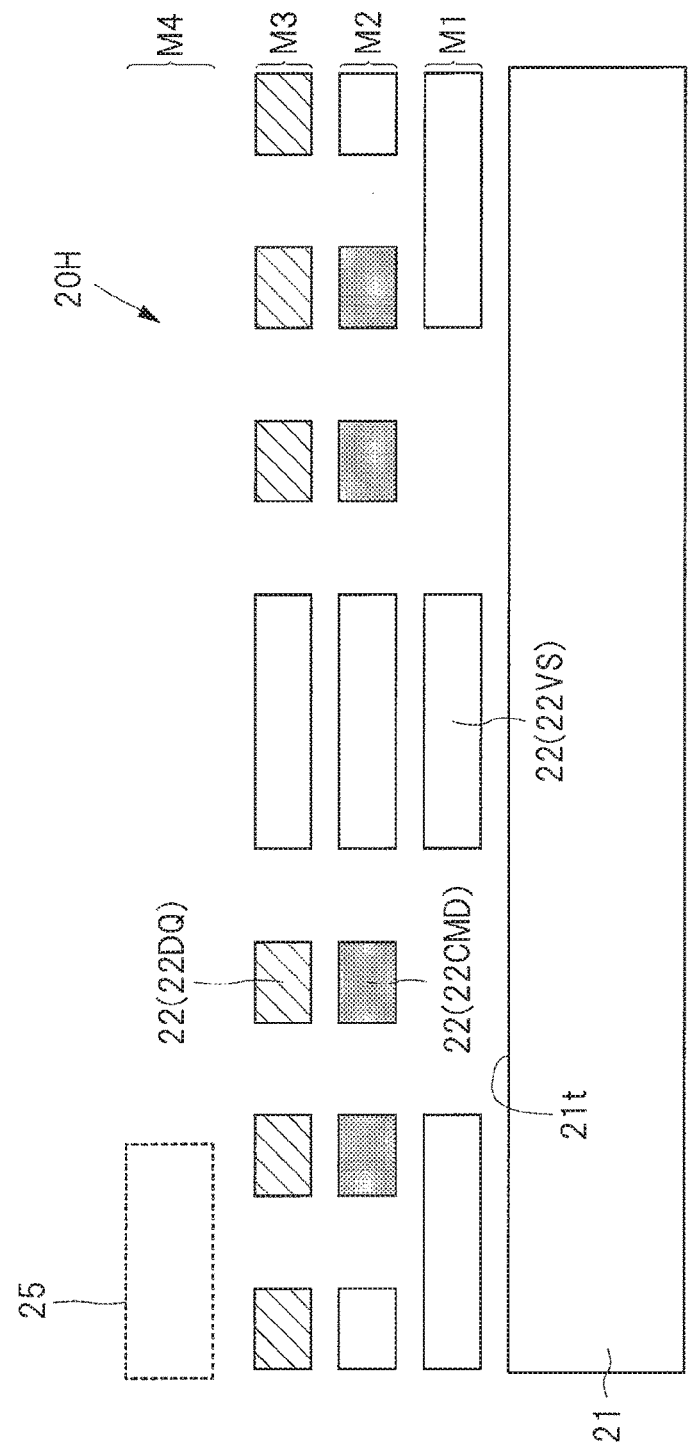
FIG. 11 is a cross-sectional view of a principal part illustrating an example of an arrangement ratio for each type of transmission targets in each wiring layer of an interposer according to a study example different from that of FIG. 10.

Incidentally, the inventors of the present invention have studied a study example illustrated in FIG. 11 as another method of suppressing the signal loss. FIG. 11 is a cross-sectional view of a principal part illustrating an example of an arrangement ratio for each type of transmission targets in each wiring layer of an interposer according to the study example different from that of FIG. 10. An interposer 20H illustrated in FIG. 11 is different from the interposer 20A illustrated in FIG. 10 in terms of the following point. That is, the reference potential wiring 22VS is mainly provided in the wiring layer M1 with the relatively close distance to the main surface 21t of the silicon substrate 21, and the signal wiring is mainly provided in the wiring layer M3 with the relatively far distance to the main surface 21t of the silicon substrate 21. In other words, the reference potential wiring 22VS is provided between the plurality of signal wirings and the silicon substrate 21 in the interposer 20H illustrated in FIG. 11.

The inventors of the present invention have conducted a study regarding a configuration in which the reference potential wiring 22VS is provided between the plurality of signal wirings and the silicon substrate 21 so that an electromagnetic field generated when the high frequency signal flows in the signal wiring is shielded by the reference potential wiring 22VS. In the case of the interposer 20H illustrated in FIG. 11, however, the shield is formed to have a mesh shape for the convenience of manufacture and the shielding effect is abated, and thus, it has been found that it is difficult to suppress the signal loss as compared to the interposer 20A illustrated in FIG. 10. This reason therefor will be described hereinafter.

When the plurality of wiring layers are stacked on the silicon substrate 21, it is possible to densify the wirings 22 by employing the process of forming the wiring layers on the semiconductor wafer. However, when flatness of each front surface of the wiring layers serving as underlying members is low, it is difficult to sufficiently decrease a wiring width of the wirings 22. Thus, it is necessary to flatten the wiring layer serving as an underlying member as preparation for stacking the wiring layers. Examples of the flattening technique include a polishing technique referred to as CMP (Chemical Mechanical Polishing). Since the CMP is the technique of flattening a polished surface by embedding the flexible insulating layer 23 (see FIG. 6) between metal patterns, it is necessary to form a clearance between the metal patterns so that the insulating layer 23 is embedded thereto. Accordingly, it is necessary to make a coating rate of a metal film (occupancy rate of the metal film on a surface on which the metal film is formed) remain at about 50%, for example, by providing a plurality of clearances between the metal films in a mesh pattern or the like.

The area of the reference potential wiring 22VS provided in the wiring layer M1 needs to be increased in order to shield the electromagnetic field generated when the high frequency signal flows in the signal wiring (for example, the data signal wiring 22DQ) illustrated in FIG. 11 by the reference potential wiring 22VS, but it is difficult to form a planar shape of the reference potential wiring 22VS in a sheet shape. Thus, the above-described electromagnetic field goes around through the clearance of the conductor pattern constituting the reference potential wiring 22VS to the silicon substrate 21. Namely, it is difficult to obtain the sufficient shielding effect by the reference potential wiring 22VS.

On the other hand, the reference potential wiring 22VS is utilized as the conductor pattern to control the distribution of the electromagnetic field in the present embodiment illustrated in FIG. 10. Accordingly, it is possible to suppress the signal loss even when the planar shape of the reference potential wiring 22VS illustrated in FIG. 10 is a linear pattern extending from one of the memory chip 30A and the logic chip 30B to the other like the wiring 22 indicated by a dotted line in FIG. 9. In addition, it is possible to suppress the signal loss even when the planar shape of the reference potential wiring 22VS illustrated in FIG. 10 is the mesh pattern. The reference potential wiring 22VS illustrated in FIG. 10 is not necessarily used solely to control the distribution of the electromagnetic field. Therefore, a part of the above-described electromagnetic field may be shielded by the reference potential wiring 22VS. In addition, the reference potential wiring 22VS illustrated in FIG. 10 may constitute a part of a return current path of a high-speed signal.

Note that an expression of "a ratio of A is higher than a ratio of B" includes the case where the ratio of B is 0% in the expression on the wiring structure described with reference to FIG. 10. In addition, an expression of "a ratio of A is lower than a ratio of B" includes the case where the ratio of A is 0%. Hereinafter, when the expression of "a ratio of A is higher (or lower) than a ratio of B" is used in this specification, the same meaning is applied. For example, the reference potential wiring 22VS is not formed in the wiring layer M1 in the example illustrated in FIG. 10, and the ratio of the signal wiring in the wirings 22 formed in the wiring layer M1 in the region 22A (see FIG. 9) is 100%.

However, as a modification example with respect to FIG. 10, the reference potential wiring 22VS may be formed in the wiring layer M1 of the region 22A (see FIG. 9). In this case, the ratio (occupancy rate) of the reference potential wiring 22VS, which is constituting a part of the transmission path of the reference potential, in the plurality of wirings 22 in the wiring layer M3 is higher than the ratio (occupancy rate) of the reference potential wiring 22VS in the wiring layer M1 as described above. Accordingly, the electromagnetic field generated at the time of performing the high-speed signal transmission is distributed mainly in the same layer as the wiring 22 or above the wiring 22, and it is thus possible to suppress the signal loss.

In addition, the wiring structure of the interposer 20A illustrated in FIG. 10 can be expressed as follows. Also, the ratio of the reference potential wiring (reference potential conductor) 22VS constituting a part of the transmission path of the reference potential in the plurality of wirings (conductor patterns) 22 arranged in the wiring layer M1 is lower than the ratio of the signal wiring (data signal wiring 22DQ or control signal wiring 22CMD) constituting a part of the signal transmission path. Further, the ratio of the reference potential wiring 22VS constituting a part of the transmission path of the reference potential in the plurality of wirings 22 arranged in the wiring layer M3 is higher than the ratio of the signal wiring constituting a part of the signal transmission path.

In the case where the above-described condition is satisfied, it is possible to say that "the signal wiring (data signal wiring 22DQ or control signal wiring 22CMD) is mainly provided in the wiring layer M1 with the relatively close distance to the main surface 21t of the silicon substrate 21, and the reference potential wiring 22VS is mainly provided in the wiring layer M3 with the relatively far distance to the main surface 21t of the silicon substrate 21". Accordingly, the electromagnetic field generated at the time of performing the high-speed signal transmission is distributed mainly in the same layer as the wiring 22 or above the wiring 22. As a result, it is possible to suppress the signal loss in the above-described configuration.

Also, in the present embodiment, the plurality of signal wirings include the control signal wiring 22CMD through which a signal is transmitted at the relatively low frequency band F1 (see FIG. 7) and the data signal wiring 22DQ through which a signal is transmitted at the frequency band F2 (see FIG. 7) that is higher than that of the control signal wiring 22CMD as illustrated in FIG. 10. For example, in the example illustrated in FIG. 4, control data signals such as the address signal and the command signal transmitted through the control signal line CMD are transmitted at a frequency equal to or lower than a half of a frequency of the data signal transmitted through the data line DQ. As is understood from FIG. 7, the degree of the signal loss is low at the frequency band F1 as compared to the frequency band F2.

When three or more wiring layers are provided and frequencies differ depending on the type of the signal like in the present embodiment, the following configuration is preferable in consideration of the result illustrated in FIG. 7. That is, it is preferable that the data signal wiring 22DQ for the transmission at the high frequency is provided in the wiring layers M2 and M3 each of which has the relatively far distance to the main surface 21t of the silicon substrate 21. Meanwhile, it is preferable that the control signal wiring 22CMD having the low degree of the signal loss is provided in the wiring layer M1 with the relatively close distance to the main surface 21t of the silicon substrate 21.

Note that the separation distance between the wiring layer M1 and the main surface 21t of the silicon substrate 21 is smaller than the thickness of the wiring 22 of the wiring layer M1, and is, for example, about 0.5 μm to 0.6 μm. In other words, a thickness of the insulating layer 23 between the wiring layer M1 and the main surface 21t of the silicon substrate 21 is smaller than the thickness of the wiring 22 of the wiring layer M1, and is, for example, about 0.5 μm to 0.6 μm. Accordingly, it is particularly preferable that the data signal wiring 22DQ is not formed in the wiring layer M1 as illustrated in FIG. 10 from a viewpoint of reducing the signal loss. However, the case of forming the data signal wiring 22DQ in the wiring layer M1 in order to increase the number of signal lines is also conceivable. In this case, it is preferable to increase the separation distance between the wiring layer M1 and the main surface 21t of the silicon substrate 21.

To be specific, the ratio of the control signal wiring 22CMD through which the signal (control signal) is transmitted at a first frequency band (for example, the frequency band F1) in the plurality of signal wirings (conductor patterns) arranged in the wiring layer M1 is higher than the ratio of the data signal wiring 22DQ through which the signal (data signal) is transmitted at a second frequency band (for example, the frequency band F2) which is higher than the first frequency band. Also, the ratio of the control signal wiring 22CMD through which the signal (control signal) is transmitted at the first frequency band (for example, the frequency band F1) in the plurality of signal wirings arranged in the wiring layer M2 is lower than the ratio of the data signal wiring 22DQ through which the signal (data signal) is transmitted at the second frequency band (for example, the frequency band F2).

Note that the expression of "a ratio of A is higher than a ratio of B" includes the case where the ratio of B is 0% as described above. In addition, the expression of "a ratio of A is lower than a ratio of B" includes the case where the ratio of A is 0%. For example, in the example illustrated in FIG. 10, the data signal wiring 22DQ is not formed in the wiring layer M1, and the ratio of the control signal wiring 22CMD in the wirings 22 formed in the wiring layer M1 of the region 22A (see FIG. 9) is 100%. In addition, the data signal wiring 22DQ is not formed in the wiring layers M2 and M3 in the example illustrated in FIG. 10.

Also, it is possible to shorten the return current path (return path) of the data signal which is transmitted through the data line DQ illustrated in FIG. 4 according to the present embodiment.

For example, when the signal is transmitted between the plurality of semiconductor chips 30 via the interposer 20A as illustrated in FIG. 6, it is preferable to shorten the return current path formed in the interposer 20A. In other words, it is preferable that the return current path which connects the semiconductor chips 30 to each other is provided at a position close to the semiconductor chip 30. For example, the ground potential is supplied to the reference potential line VS2 for reference illustrated in FIG. 4, and the reference potential line VS2 functions also as the return current path of the data signal transmitted through the data line DQ at the same time.

When the reference potential wiring 22VS illustrated in FIG. 10 constitutes apart of the reference potential line VS2 for reference, it is possible to shorten a path length of the return current by providing the reference potential wiring 22VS at the position close to the semiconductor chip 30 illustrated in FIG. 6.

Here, in the interposer 20A according to the present embodiment illustrated in FIG. 10, the reference potential wiring 22VS is mainly formed in the wiring layer M3 close to the surface electrode 25. Accordingly, it is possible to shorten a transmission distance of the reference signal as compared to the interposer 20H illustrated in FIG. 11.

In addition, in the example illustrated in FIG. 10, the data signal wiring 22DQ for the transmission at the high frequency band F2 (see FIG. 7) is mainly formed in the wiring layer M2 closer to the surface electrode 25 than the wiring layer M1. Thus, it is possible to suppress the increase of a transmission distance of the high frequency signal even when the reference potential wiring 22VS is mainly formed in the wiring layer M3.

Figure 12:
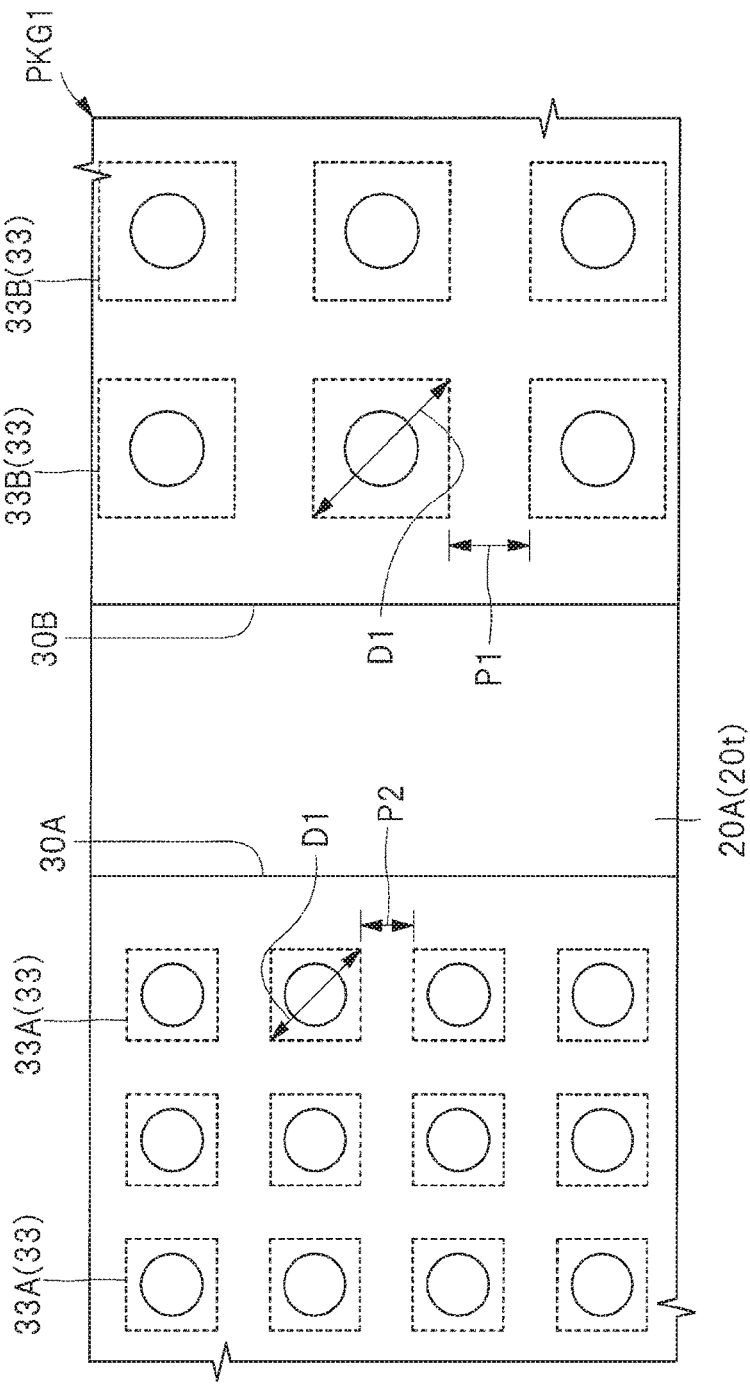
FIG. 12 is an enlarged plan view of a section B illustrated in FIG. 1.

Also, the following configuration is preferable from a viewpoint of improving electrical characteristics of the transmission path connected to the logic chip 30B illustrated in FIG. 6. FIG. 12 is an enlarged plan view of a section B illustrated in FIG. 1. Note that each contour of an electrode 33A of the memory chip 30A, an electrode 33B of the logic chip 30B, and the surface electrode 25 of the interposer 20A is indicated by dotted lines in FIG. 12 in order to illustrate a planar shape of a connection part between the semiconductor chip 30 and the interposer 20A. In addition, in the example illustrated in FIG. 12, the contour of the electrode 33A and the contour of the surface electrode 25 connected to the electrode 33A substantially overlap each other, and the contour of the electrode 33B and the contour of the surface electrode 25 connected to the electrode 33B substantially overlap each other. Also, a plurality of openings are provided in the passivation film 26 that covers the front surface of the interposer 20A as described above, and apart of the surface electrode 25 is exposed from the passivation film 26 in the opening. In FIG. 12, a contour of the opening which exposes a part of the surface electrode 25 of the interposer 20A is indicated by a solid-line circle.

As illustrated in FIG. 4, the logic chip 30B includes the external interface circuit IF1, which inputs or outputs a signal from or to the external device 40 in addition to the internal interface circuit IF2 which inputs or outputs a signal from or to the memory chip 30A. Thus, the number of the signal lines (the signal line SIG, the data line DQ, and the control signal line CMD) connected to the logic chip 30B is larger than the number of the signal lines (the data line DQ and the control signal line CMD) connected to the memory chip 30A. In addition, the transmission speed of the signal line SIG illustrated in FIG. 4 is higher than the transmission speed of the data line DQ. Thus, it is necessary to strengthen the transmission path for the signal line SIG connected to the logic chip 30B or the power supply lines VD1 and VS1 that supply the drive voltage for the logic chip 30B.

Therefore, in the example of the present embodiment, the plurality of (two in FIG. 6) through electrodes 24 are connected to each of the electrodes 33 in the case of the plurality of electrodes 33 included in the logic chip 30B as illustrated in FIGS. 5 and 6. On the other hand, the one through electrode 24 is connected to each of the electrodes 33 in the case of the plurality of electrodes 33 included in the memory chip 30A as illustrated in FIG. 6. Namely, the number of the through electrodes 24 connected to each of the plurality of electrodes 33 of the logic chip 30B is larger than the number of the through electrodes 24 connected to each of the plurality of electrodes 33 of the memory chip 30A. Accordingly, when the plurality of through electrodes 24 (see FIG. 6) are connected in parallel as the transmission path of the signal line SIG illustrated in FIG. 4, it is possible to reduce the electrical resistance of the transmission path of the electrical signal, and it is thus possible to suppress a decrease of input and output voltages of the signal. In addition, when the plurality of through electrodes 24 (see FIG. 6) are connected in parallel as the transmission path of the power supply line VD1 and the reference potential line VS1 illustrated in FIG. 4 which supply the drive voltage to the logic chip 30B, it is possible to reduce the electrical resistance of the transmission paths of the power supply potential and the reference potential, and it is thus possible to suppress a voltage drop of the drive voltage. Note that a path that performs the signal transmission between the semiconductor chips such as the data line DQ among the plurality of electrodes 33 is not connected to the through electrode 24 as illustrated in FIG. 6.

In addition, from the viewpoint of strengthening the transmission path, the following configuration is preferable for the signal line SIG connected to the logic chip 30B or the power supply lines VD1 and VS1 that supply the drive voltage for the logic chip 30B illustrated in FIG. 4. As illustrated in FIG. 12, it is preferable that an area of a surface electrode 25B of the electrode 33B of the logic chip 30B is larger than an area of a surface electrode 25A of the electrode 33A of the memory chip 30A. The plurality of transmission paths of the interposer 20A can be connected to the one electrode 33B by increasing the plane area of the surface electrode 25B.

To be specific, a diameter D1 of the electrode (surface electrode, pad) 33B of the logic chip 30B is larger than a diameter D2 of the electrode (surface electrode, pad) 33A of the memory chip 30A. Note that FIG. 12 illustrates a case where each planar shape of the electrode 33A and the electrode 33B is a rectangular shape, and a diagonal of the rectangular shape is defined as a value of the diameter D2 or the diameter D1. However, each planar shape of the electrode 33A and the electrode 33B may be a shape other than the rectangular shape. For example, when each planar shape of the electrode 33A and the electrode 33B is a circular shape, a diameter of the circle is defined as a value of the diameter D2 or the diameter D1.

Also, a separation distance P1 between the neighboring electrodes 33B among the plurality of electrodes 33B is larger than a separation distance P2 between the neighboring electrodes 33A among the plurality of electrodes 33A. Note that, when a large number of electrodes 33B and a large number of electrodes 33A are provided and the separation distance P1 and the separation distance P2 take a plurality of values, the separation distance P1 and the separation distance P2 described above are evaluated with the smallest value among the respective separation distances.

When the diameter D1 of the electrode 33B of the logic chip 30B is large as illustrated in FIG. 12, it is possible to increase a diameter of the surface electrode 25 of the interposer 20A to be connected to the electrode 33 of the logic chip 30B as illustrated in FIG. 6. Accordingly, it is possible to connect the plurality of (two in FIG. 6) through electrodes 24 to the one electrode 33 included in the logic chip 30B as illustrated in FIG. 6.

<First Modification Example>

Figure 13:
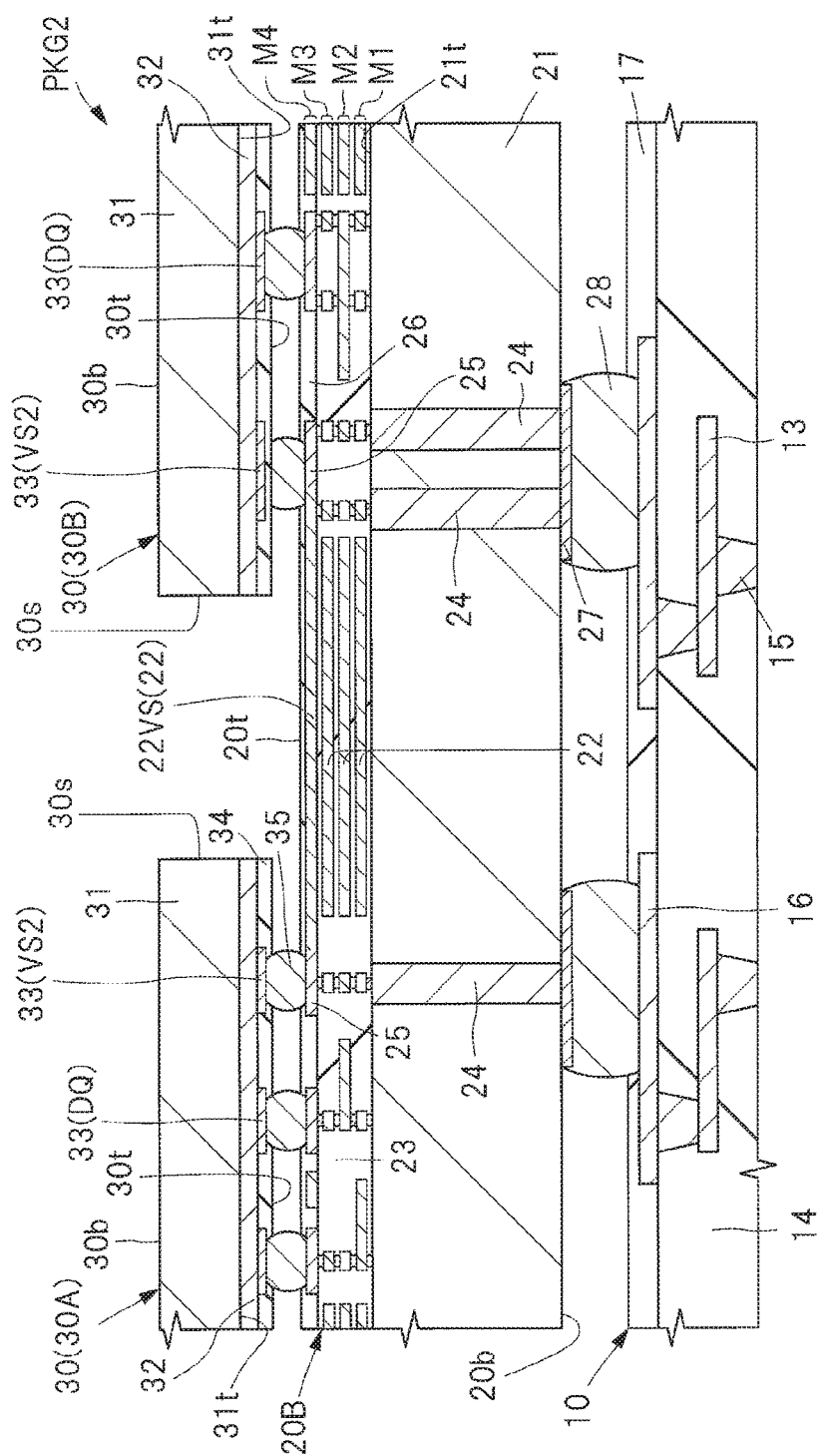
FIG. 13 is an enlarged cross-sectional view of a semiconductor device which is a modification example with respect to FIG. 6.
Figure 14:
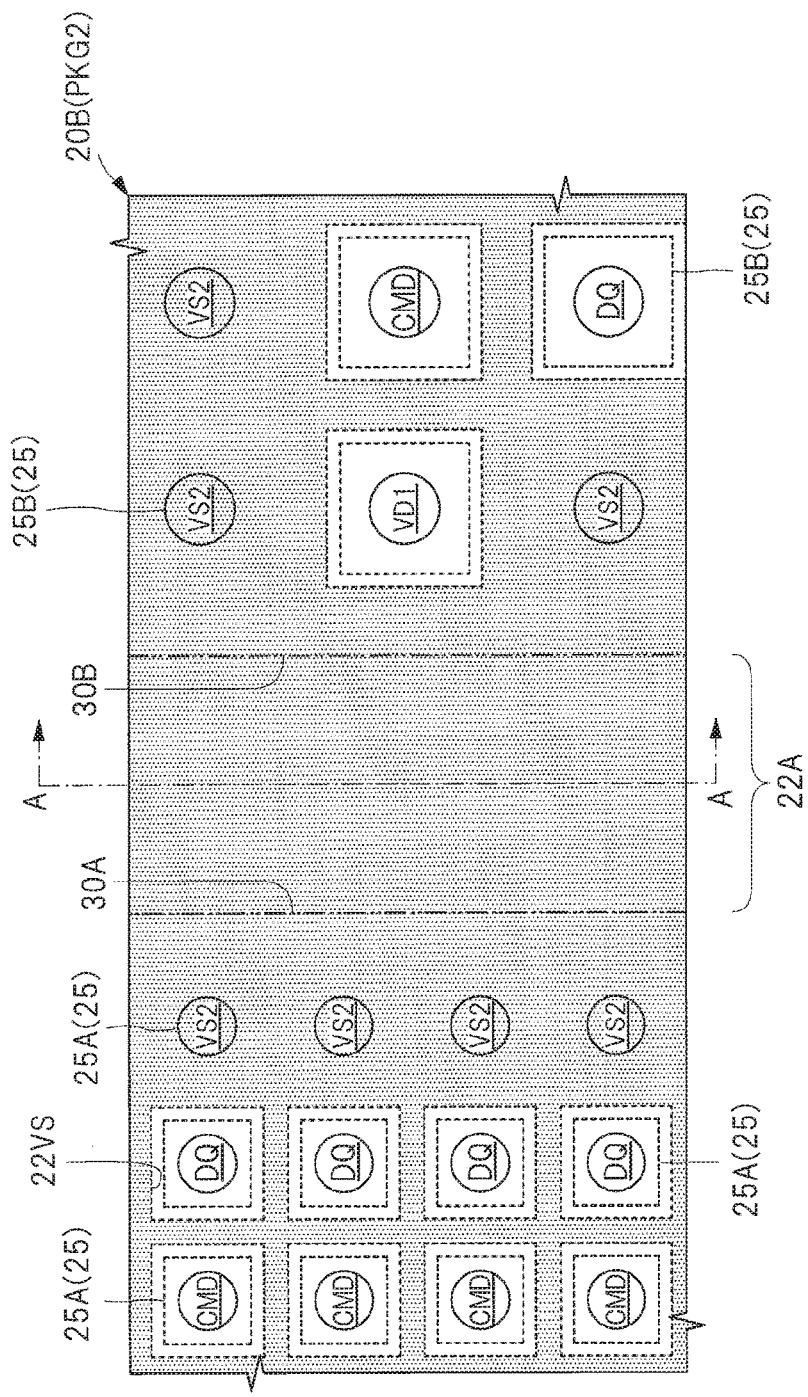
FIG. 14 is an enlarged plan view of the semiconductor device illustrated in FIG. 13 illustrating a modification example with respect to FIG. 12.
Figure 15:
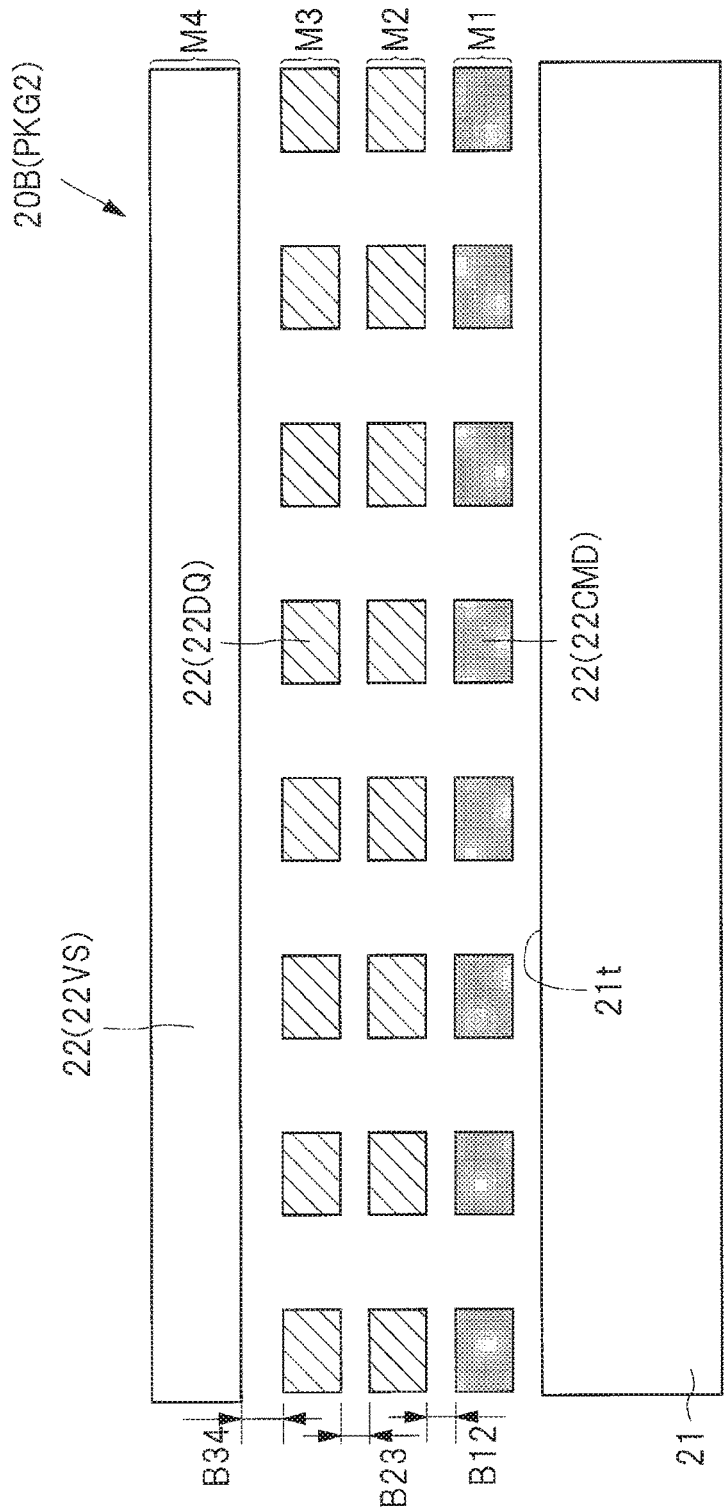
FIG. 15 is an enlarged cross-sectional view taken along a line A-A of FIG. 14.
Figure 16:
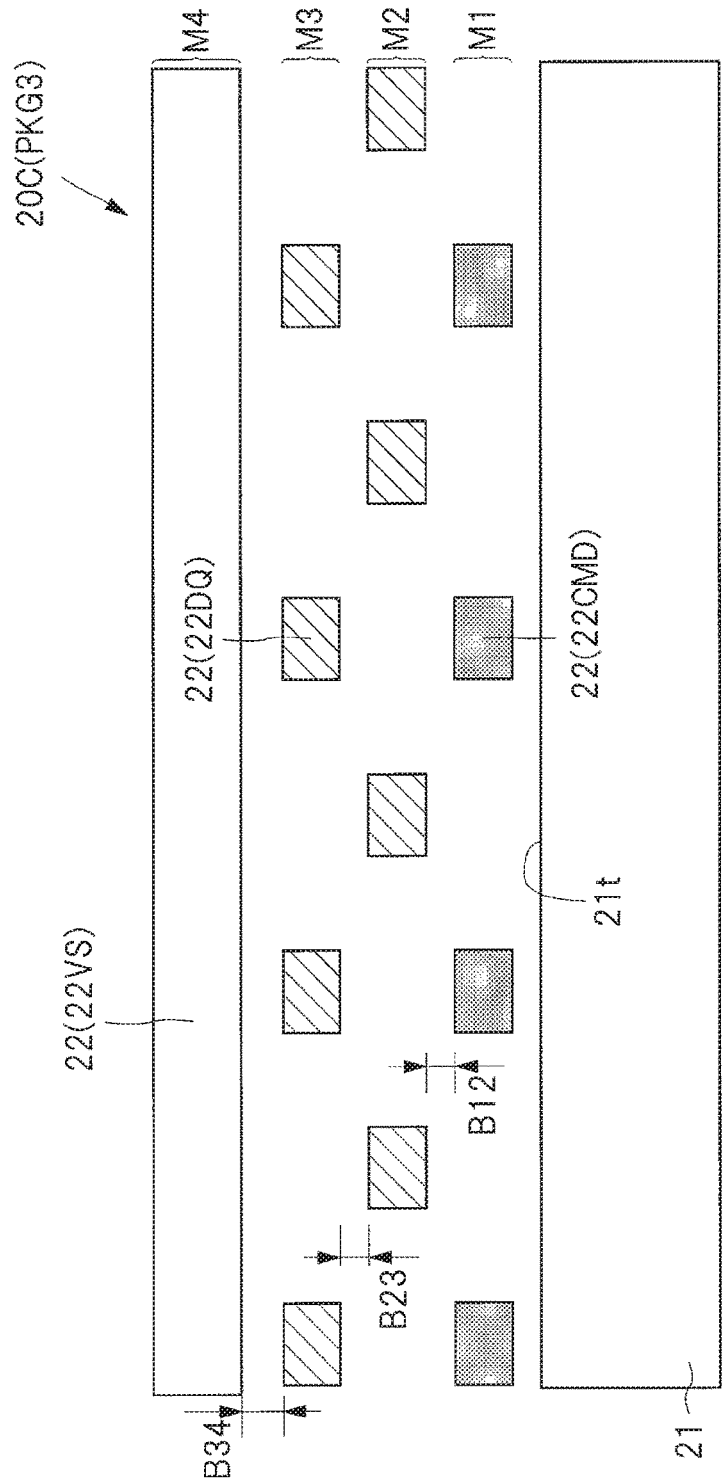
FIG. 16 is a cross-sectional view of a principal part illustrating a modification example with respect to FIG. 10 and an example of an arrangement ratio for each type of transmission targets in each wiring layer of the interposer illustrated in FIGS. 5 and 6.
Figure 17:
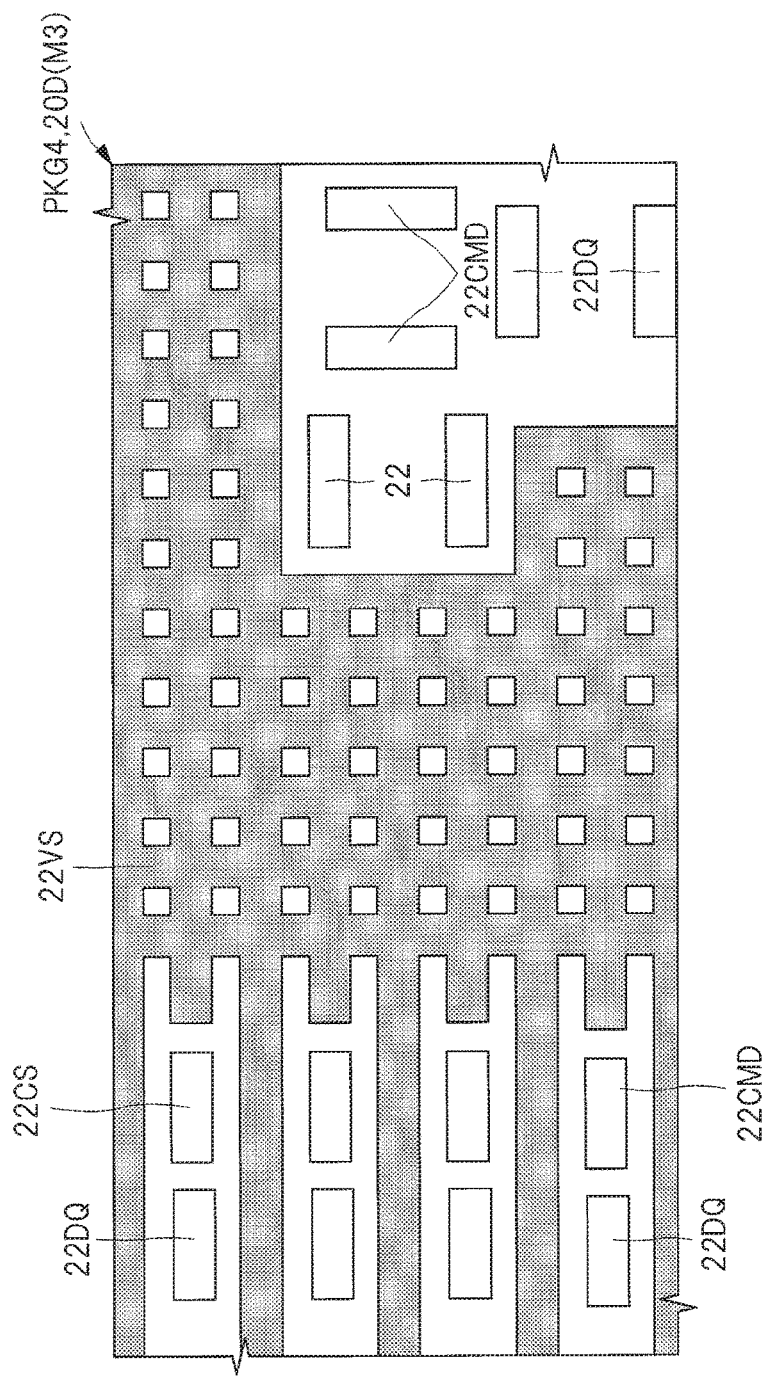
FIG. 17 is an enlarged plan view illustrating a structure example of a wiring layer which is right below a layer in which a plurality of surface electrodes of the interposer illustrated in FIG. 6 are formed.

Next, a modification example of the present embodiment will be described. First, a mode in which the reference potential wiring 22VS constituting a part of a transmission path of a reference potential is formed in the uppermost wiring layer (electrode pad layer) M4 in which the plurality of surface electrodes 25 are formed will be described as a first modification example. FIG. 13 is an enlarged cross-sectional view of a semiconductor device which is a modification example with respect to FIG. 6. In addition, FIG. 14 is an enlarged plan view of the semiconductor device illustrated in FIG. 13 illustrating a modification example with respect to FIG. 12. Also, FIG. 15 is a cross-sectional view of a principal part illustrating a modification example with respect to FIG. 10 and an example of an arrangement ratio for each type of transmission targets in each wiring layer of the interposer illustrated in FIGS. 5 and 6. Further, FIG. 16 is a cross-sectional view of a principal part illustrating another modification example with respect to FIG. 10. Furthermore, FIG. 17 is an enlarged plan view illustrating a structure example of a wiring layer which is right below a layer in which the plurality of surface electrodes of the interposer illustrated in FIG. 6 are formed.

In FIG. 14, each contour of the surface electrode 25A of the interposer 20B connected to the memory chip 30A, the surface electrode 25B of the interposer 20B connected to the logic chip 30B, and the reference potential wiring 22VS is indicated by dotted lines in order to illustrate a planar shape of a connection part between the semiconductor chip 30 and the interposer 20B. In addition, a plurality of openings are provided in the passivation film 26 (see FIG. 13) that covers a front surface of the interposer 20B, and a part of the surface electrode 25 is exposed from the passivation film 26 in the opening. In FIG. 14, each contour of the opening which exposes a part of the surface electrode 25 of the interposer 20B is indicated by a solid-line circle, and types of the transmission paths constituted of the respective exposed parts are described with underlines. In addition, a pattern (dot pattern) is attached to the reference potential wiring 22VS in FIGS. 14 and 17 in order to make a boundary between a conductor pattern constituting the reference potential wiring 22VS and a conductor pattern constituting another transmission path easy to see.

A semiconductor device PKG2 illustrated in FIG. 13 is different from the semiconductor device PKG1 illustrated in FIG. 6 in terms of wiring layout of the interposer 20B. To be specific, the interposer 20B included in the semiconductor device PKG2 is different from the interposer 20A illustrated in FIG. 6 in terms that the reference potential wiring 22VS constituting a part of the transmission path of the reference potential is formed in the uppermost wiring layer M4 in which the plurality of surface electrodes 25 are formed.

In other words, the interposer 20B is different from the interposer 20A in terms that most of the reference potential wirings 22VS are formed in the same layer as the plurality of surface electrodes 25.

In addition, in the region 22A (see FIG. 14) sandwiched between the neighboring semiconductor chips 30, a ratio of the reference potential wiring 22VS, which is constituting a part of the transmission path of the reference potential, in the wirings 22 arranged in the wiring layer M4 of the interposer 20B is higher than a ratio of a signal wiring, which is constituting a part of the signal transmission path. In the example illustrated in FIG. 14, a conductor pattern other than the reference potential wiring 22VS is not formed in the region 22A.

In the present modification example, the reference potential wiring 22VS constituting the reference potential line VS2 (see FIG. 14) is provided in a region in which the surface electrode 25 is not arranged in the wiring layer M4 which is the uppermost wiring layer, that is, the wiring layer to be formed at a position farthest from the main surface 21t of the silicon substrate 21.

In addition, the surface electrode 25 and the reference potential wiring 22VS constituting the reference potential line VS2 of the interposer 20B are formed integrally with each other as illustrated in FIG. 14. In other words, the surface electrode 25 and the reference potential wiring 22VS constituting the reference potential line VS2 are connected to each other. Thus, in the region 22A of the uppermost wiring layer M4 of the interposer 20B, the reference potential wiring 22VS is formed so as to cover most of the wiring layer M3 (see FIG. 13), and a part of the reference potential wiring 22VS functions as the surface electrode 25 for the transmission of reference potential. In addition, in a peripheral region of the region 22A, an opening is formed in the reference potential wiring 22VS2 at a position at which the surface electrode 25 constituting the transmission path other than the reference potential line VS2, for example, the transmission path for the signal line SG or the power supply lines VD1 and VD2 illustrated in FIG. 4 is arranged, and the surface electrode 25 is formed inside the opening.

In the case of the interposer 20B, it is possible to distribute an electromagnetic field to the upper side by providing the reference potential wiring 22VS in the uppermost layer like in the case of the interposer 20A described with reference to FIG. 10. Thus, it is possible to suppress the flowing of current CF (see FIG. 8) in the silicon substrate 21.

In addition, since the wiring layer M4 is used as the transmission path of the reference potential in the case of the interposer 20B, it is possible to increase the number of wirings of the data signal wiring 22DQ serving as a high-speed transmission path in the wiring layer M2 and the wiring layer M3 as illustrated in FIG. 15. For example, the reference potential wiring 22VS is not formed but only the data signal wiring 22DQ is arranged in each of the wiring layer M2 and the wiring layer M3 in the region 22A (see FIG. 14) in the example illustrated in FIG. 15. Thus, the number of wirings of the data signal wiring 22DQ can be increased in the interposer 20B illustrated in FIG. 15 as compared to the interposer 20A illustrated in FIG. 10.

However, the reference potential wiring 22VS may be arranged in the wiring layer M2 and the wiring layer M3 as a modification example with respect to the example illustrated in FIG. 15. Also in such a case, the number of wirings of the data signal wiring 22DQ provided in each of the wiring layer M2 and the wiring layer M3 can be increased as compared to the interposer 20A illustrated in FIG. 10. In addition, since the control signal wiring 22CMD is mainly provided in the wiring layer M1, it is also possible to sufficiently secure the number of wirings for the control signal wirings 22CMD. Also, the control signal wiring 22CMD may be arranged in the wiring layer M2 and the wiring layer M3 as a modification example with respect to the example illustrated in FIG. 15.

Further, when the wiring layer M4 is utilized as a supply space of the reference potential wiring 22VS like in an interposer 20C included in a semiconductor device PKG3 illustrated in FIG. 16, it is possible to increase each separation distance among the plurality of data signal wirings 22DQ provided in the wiring layer M2 and the wiring layer M3.

In the interposer 20C, the reference potential wiring 22VS is formed in the wiring layer M4, and a wiring for a high-speed signal transmission path is formed to have a large distance from other wirings. To be specific, the data signal wiring 22DQ provided in the wiring layer M2 is provided so as not to overlap the control signal wiring 22CMD formed in the wiring layer M1 in the thickness direction. In addition, the data signal wiring 22DQ provided in the wiring layer M2 is arranged so as not to overlap the control signal wiring 22CMD formed in the wiring layer M1 in the thickness direction. Accordingly, it is possible to reduce crosstalk between the data signal transmission path and other signal transmission paths. Namely, the interposer 20C illustrated in FIG. 16 is a configuration example in the case of focusing on the suppression of the crosstalk in the wiring that performs the high-speed signal transmission.

Note that, since the wiring layer M2 is provided between the data signal wiring 22DQ formed in the wiring layer M3 and the control signal wiring 22CMD formed in the wiring layer M1, the data signal wiring 22DQ formed in the wiring layer M3 and the control signal wiring 22CMD formed in the wiring layer M1 may overlap each other. In addition, since the wiring layer M4 is the uppermost wiring layer having the surface electrode 25 formed therein (see FIG. 6), a separation distance B34 between the wiring layer M3 and the wiring layer M4 is larger than a separation distance B12 between the wiring layer M1 and the wiring layer M2 and a separation distance B23 between the wiring layer M2 and the wiring layer M3. Accordingly, the data signal wiring 22DQ formed in the wiring layer M3 and the reference potential wiring 22VS formed in the wiring layer M4 may overlap each other in the thickness direction.

In addition, since the wiring layer M4 is the uppermost wiring layer as illustrated in FIGS. 15 and 16, it is unnecessary to perform a flattening process for the reference potential wiring 22VS formed in the wiring layer M4. Thus, as illustrated in FIG. 14, an opening is not necessarily provided except for the opening in which the surface electrode 25 for the transmission path other than the reference potential is provided, and it is possible to form a sheet-shaped conductor pattern which spreads uniformly.

Note that it is possible to form the reference potential wiring 22VS having a wide area in the wiring layer M3 like in an interposer 20D of a semiconductor device PKG4 illustrated in FIG. 17 even when the reference potential wiring 22VS is not formed in the wiring layer M4. A reference potential wiring of the interposer 20D illustrated in FIG. 23 has a larger area than the other wirings 22. However, since it is necessary to form the plurality of surface electrodes 25 (see FIG. 10) in the wiring layer M4 (see FIG. 10) serving as the uppermost layer, it is difficult to form a conductor pattern formed in the wiring layer M3, which is not the uppermost layer, in a sheet shape. For example, the reference potential wiring 22VS of the interposer 20D is a mesh-shaped conductor pattern (mesh pattern) in which a large number of conductor patterns extending linearly intersect each other as illustrated in FIG. 17.

However, it is more preferable to form the sheet shape pattern than to form the mesh pattern if the electrical characteristics of the circuit are taken into consideration. For example, the reference potential wiring 22VS formed in the sheet shape as illustrated in FIG. 14 has a lower electrical resistance than the reference potential wiring 22VS formed in the mesh shape as illustrated in FIG. 17. Thus, when the reference potential wiring 22VS is used as the reference potential line VS2 for reference (see FIG. 4), the sheet-shaped reference potential wiring 22VS can reduce a variation of signal line characteristics.

In addition, when the reference potential wiring 22VS is used as the reference potential line VS1 (see FIG. 4) for supplying the reference potential for the drive voltage, it is possible to suppress the voltage drop as the electrical resistance of the reference potential wiring 22VS decreases.

Further, when the case in which the reference potential wiring 22VS is used to function as a shield layer of the electromagnetic field is taken into consideration, the sheet-shaped reference potential wiring 22VS is more likely to shield the electromagnetic field than the mesh-shaped reference potential wiring 22VS. Accordingly, it is possible to reduce the signal loss.

<Second Modification Example>

Figure 18:
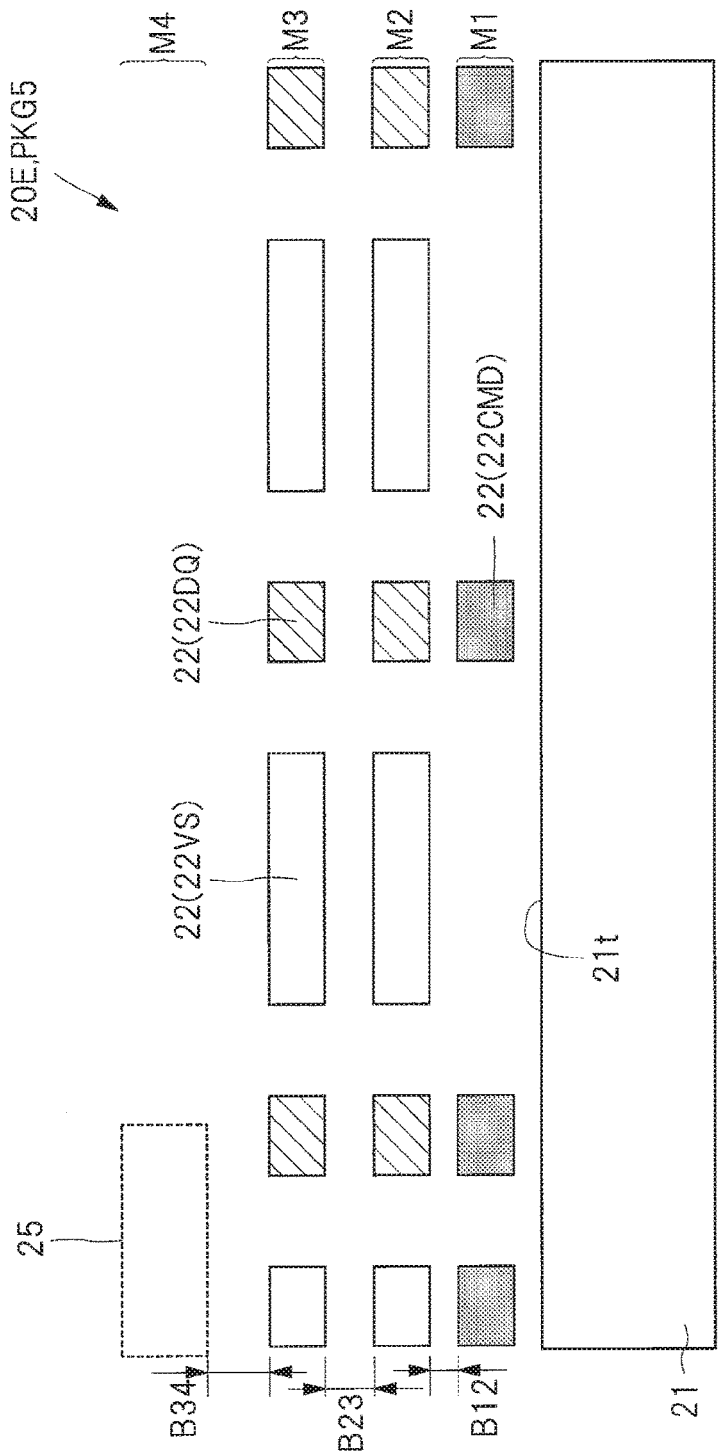
FIG. 18 is a cross-sectional view of a principal part illustrating a modification example with respect to FIG. 10 and an example of distances between wiring layers of an interposer and an arrangement ratio for each type of transmission targets.
Figure 19:
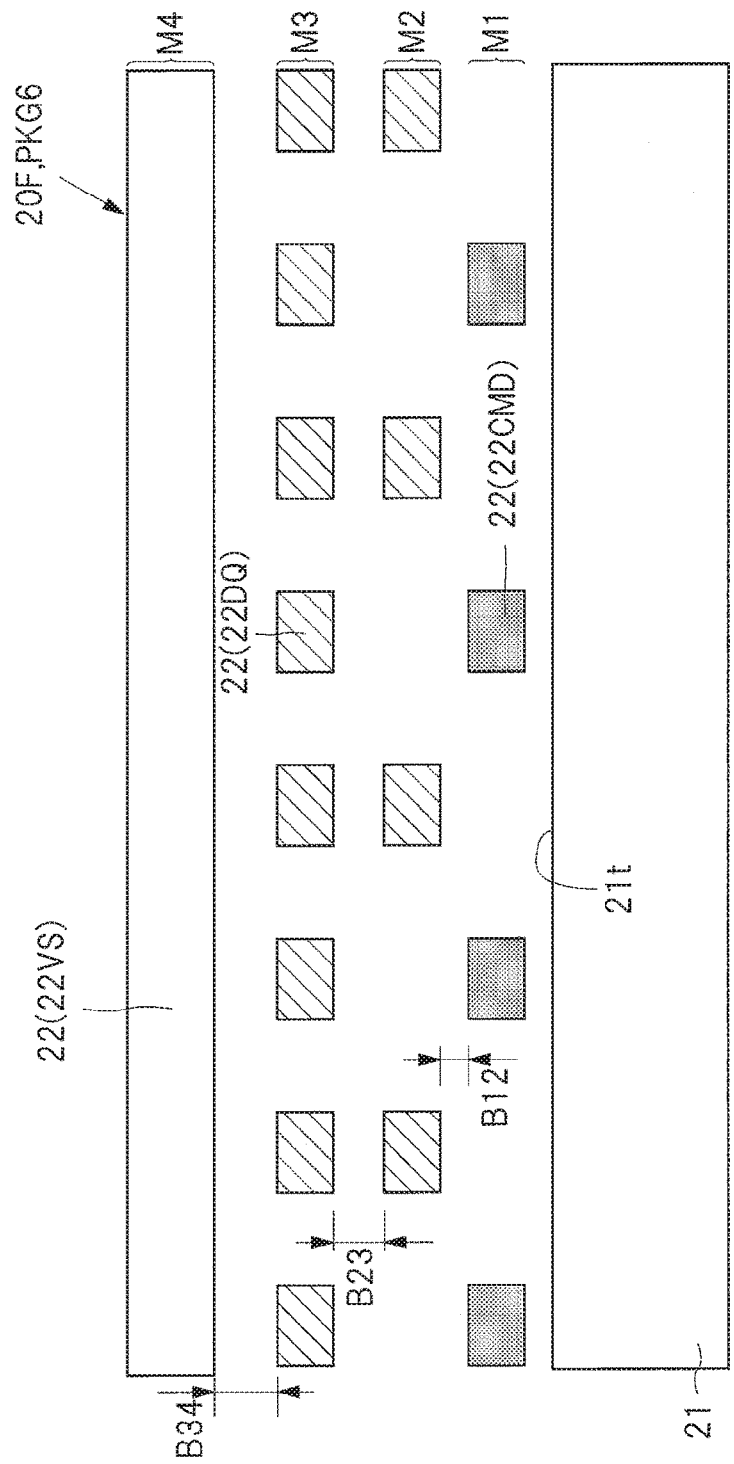
FIG. 19 is a cross-sectional view of a principal part illustrating another modification example with respect to FIG. 10.

Next, a mode in which the wiring layers are formed to have different separation distances between the respective wiring layers will be described as a second modification example. FIG. 18 is a cross-sectional view of a principal part illustrating a modification example with respect to FIG. 10 and an example of distances between wiring layers of an interposer and an arrangement ratio for each type of transmission targets. In addition, FIG. 19 is a cross-sectional view of a principal part illustrating another modification example with respect to FIG. 10. Note that FIGS. 18 and 19 illustrate the silicon substrate 21, the wirings 22 constituting the respective wiring layers, and the surface electrode 25 and do not illustrate the insulating layer 23 (see FIG. 6) that covers the respective wiring layers like in the enlarged cross-sectional view illustrated in FIG. 10.

A semiconductor device PKG5 illustrated in FIG. 18 is different from the semiconductor device PKG1 illustrated in FIG. 10 in terms of the distances between the wiring layers of an interposer 20E. To be specific, the interposer 20E included in the semiconductor device PKG5 is different from the interposer 20A illustrated in FIG. 10 in terms that the separation distance B23 between the wiring layer M3 and the wiring layer M2 is larger than the separation distance B12 between the wiring layer M2 and the wiring layer M1. Further, the separation distance B34 between the wiring layer M4 and the wiring layer M3 is still larger than the separation distance B23 between the wiring layer M3 and the wiring layer M2 in the example illustrated in FIG. 18. In other words, the separation distance between the wiring layers increases as a distance from the silicon substrate 21 increases in the interposer 20D.

A method of stacking the wiring layers on the silicon substrate 21 is performed in the following manner, for example. First, the insulating layer 23 (see FIG. 6) is deposited on the main surface 21t of the silicon substrate 21 (insulating layer depositing process). Next, an opening is formed in the insulating layer 23, and a conductor is embedded in the opening (conductor embedding process). Next, a top surface (surface spaced from the main surface 21t of the silicon substrate 21) of the insulating layer in which the conductor is embedded is polished and flattened by, for example, the CMP (polishing process). In this manner, the wiring layer M1 of the first layer is formed. Next, an insulating layer is deposited on the wiring layer M1 of the first layer (insulating layer depositing process). Hereinafter, the conductor embedding process, the polishing process, and the insulating layer depositing process are repeatedly performed in the same manner, thereby stacking the plurality of wiring layers.

When the wiring layers are stacked in the above-described method, it is preferable to decrease the separation distance between the wiring layers and the thickness of the wiring layer in order to improve the flatness of the top surface of the wiring layer. In addition, when the plurality of wiring layers are stacked, higher flatness is required for a lower wiring layer than an upper wiring layer. Accordingly, it is preferable to decrease the separation distance between the wiring layers at a position relatively close to the silicon substrate 21. Meanwhile, it is also possible to set the separation distance B23 and the separation distance B12 to be the same value at the position relatively close to the wiring layer M4 of the uppermost layer like in the example illustrated in FIG. 10, but the separation distance B23 may be set to be larger than the separation distance B12 like in the modification example illustrated in FIG. 18.

Further, the following effect is obtained when the separation distance B23 is made larger than the separation distance B12.

When the process similar to the process of forming the wirings on the semiconductor wafer is used for each of the above-described interposers 20A, 20B, 20C and 20D, it is possible to improve the wiring density of the plurality of wirings 22 as compared to, for example, the wiring density of the wirings 13 of the wiring substrate 10 illustrated in FIG. 6. The thickness of the wiring 22 is, for example, about 1 µm to 1.2 µm, and each separation distance among the stacked wiring layers M1, M2 and M3 is about a half of the thickness of the wiring 22.

However, if the thickness of each of the plurality of wirings 22 is decreased, the wiring resistance is increased. Thus, there occurs a problem that it is difficult to approximate an impedance value of each signal transmission path to a predetermined value.

For example, when a design value of a characteristic impedance of the data line DQ illustrated in FIG. 4 is 50 Ω [Ohm], it is preferable to approximate the impedance value to 50 Ω in each of the wiring path using the data signal wiring 22DQ and the wiring path using the reference potential wiring 22VS for reference illustrated in FIGS. 10 and 18.

When a time constant formed of the parasitic capacitance of the input and output circuit to which the data line DQ is connected and the wiring resistance is assumed as τ, τ is defined as follows.

τ=(signal wiring resistance +reference potential line resistance)×(parasitic capacitance of output circuit+parasitic capacitance of input circuit)

Here, when the wiring resistance of the data signal wiring 22DQ and the reference potential wiring 22VS is large, the value of τ becomes large, which causes the signal waveform to be blunt.

Meanwhile, since a capacitance component of the characteristic impedance defined as √(inductance/capacitance) is inversely proportional to the separation distance between the wiring layers, the capacitance component of the characteristic impedance becomes a large value when the separation distance is small. Thus, the capacitance component of the characteristic impedance is further increased if the wiring width is increased in order to lower the above-described wiring resistance, and the characteristic impedance becomes much lower than 50 Ω. This causes the signal waveform to be blunt.

As described above, a margin to adjust the resistance component and the capacitance component of the characteristic impedance decreases when the thickness of the wiring layer is small and the separation distance between the wiring layers is small. The resistance component and the capacitance component of the characteristic impedance have a trade-off relationship, and it becomes difficult to adjust the characteristic impedance when the margin to adjust the resistance component and the capacitance component decreases, and it becomes difficult to approximate the impedance of the signal transmission path to a predetermined value.

Thus, the trade-off relationship is improved when the separation distance B23 is set to be larger than the separation distance B12 as illustrated in FIG. 18. Namely, by increasing the separation distance B23 between the wiring layer M2 in which the data signal wiring 22DQ is mainly provided and the wiring layer M3 in which the reference potential wiring 22VS is mainly provided, the capacitance component of the characteristic impedance hardly decreases even when the wiring width is increased. As a result, the characteristic impedance is easily approximated to 50 Ω in each of the wiring path using the data signal wiring 22DQ and the wiring path using the reference potential wiring 22VS for reference.

In addition, the separation distance B34 between the wiring layer M4 and the wiring layer M3 is still larger than the separation distance B23 between the wiring layer M3 and the wiring layer M2 in the example illustrated in FIG. 18. Since the wiring layer M4 is the wiring layer of the uppermost layer, a degree of flatness of the surface electrode 25 in the uppermost layer may be lower than a degree of flatness of the wiring 22 in other layers. Thus, it is possible to set the separation distance B34 to be large in particular. When the wiring 22 is not formed in the wiring layer M4 in the region 22A (see FIG. 9) as illustrated in FIG. 18, a magnitude of the separation distance B34 illustrated in FIG. 7 has little influence from a viewpoint of adjusting the characteristic impedance of the wiring path. However, the following effect is obtained in a case where the reference potential wiring 22VS is formed in the wiring layer M4 like in an interposer 20F included in a semiconductor device PKG6 according to a modification example illustrated in FIG. 19.

In the interposer 20F illustrated in FIG. 19, the reference potential wiring 22VS constituting the reference potential line VS is provided in the wiring layer M4, which is the wiring layer formed at a position farthest from the main surface 21t of the silicon substrate 21, in the region 22A (see FIG. 9). In addition, the data signal wiring 22DQ through which the data signal is transmitted at high speed (for example, at the frequency band F2 illustrated in FIG. 7) is mainly formed in the wiring layer M3. Namely, the reference potential wiring 22VS is mainly provided in the wiring layer M4 of the uppermost layer, and the data signal wiring 22DQ for the high-speed transmission is mainly provided in the wiring layer M3 in the interposer 20E.

The above-described wiring structure can also be expressed as follows. That is, in the region 22A (see FIG. 9), a ratio of the reference potential wiring 22VS, which is constituting a part of the transmission path of the reference potential, in the wirings 22 arranged in the wiring layer M4 of the interposer 20F is higher than a ratio of the signal wiring, which is constituting a part of the signal transmission path. In addition, a ratio of the control signal wiring 22CMD through which the signal (control signal) is transmitted at the first frequency band (for example, the frequency band F1) in the plurality of signal wirings arranged in the wiring layer M3 is lower than a ratio of the data signal wiring 22DQ through which the signal (data signal) is transmitted at the second frequency band (for example, the frequency band F2).

The above-described expression of "a ratio of A is higher than a ratio of B" includes the case where the ratio of B is 0%. In addition, the expression of "a ratio of A is lower than a ratio of B" includes the case where the ratio of A is 0%. In the example illustrated in FIG. 19, for example, only the reference potential wiring 22VS is formed in a sheet shape and the other wirings 22 are not formed in the wiring layer M4 (see FIG. 19) in the region 22A (see FIG. 14) like in the interposer 20B illustrated in FIG. 14. Also, the control signal wiring 22CMD and the reference potential wiring 22VS are not formed in the wiring layer M3 in the region 22A (see FIG. 9) in the example illustrated in FIG. 19.

When the reference potential wiring 22VS is provided in the wiring layer M4 and the data signal wiring 22DQ which performs signal transmission at a high frequency is provided in the wiring layer M3 like in the interposer 20F, the characteristic impedance of the signal transmission path is changed depending on a separation distance between the reference potential wiring 22VS and the data signal wiring 22DQ. This distance between the data signal wiring 22DQ and the reference potential wiring 22VS is defined by the separation distance B34 between the wiring layer M4 and the wiring layer M3.

Accordingly, since the separation distance B34 is set to be still larger than the separation distance B23 as illustrated in FIG. 19, a value of the characteristic impedance of the data signal wiring 22DQ can be easily approximated to a predetermined value (for example, 50 Ω).

In addition, the thickness of the wiring 22 can be increased in the wiring layer M4 of the uppermost layer as compared to the other wiring layers M1, M2 and M3. Thus, the interposer 20F is preferable from a viewpoint of reducing the wiring resistance of the reference potential wiring 22VS.

In addition, the structure of the interposer 20C which has been described with reference to FIG. 16 in <First Modification Example> described above is also preferable in terms that it is easy to approximate the characteristic impedance of the signal transmission path at the high frequency to a predetermined value. Namely, in the example illustrated in FIG. 16, each of the plurality of data signal wirings 22DQ provided in the wiring layer M2 does not overlap the plurality of wirings 22 provided in the wiring layer M1 and the plurality of wirings 22 provided in the wiring layer M3 in the thickness direction in the region 22A (see FIG. 9). In this case, it is possible to separate the data signal wiring 22DQ and the other wiring 22, and it is thus possible to easily approximate the characteristic impedance of the signal transmission path to the predetermined value.

Meanwhile, in the case of the interposer 20F included in the semiconductor device PKG6 illustrated in FIG. 19, the separation distance B23 between the wiring layer M2 and the wiring layer M3 is larger than the separation distance B12. Thus, it is possible to reduce the influence on the characteristic impedance by the overlapping of the data signal wiring 22DQ of the wiring layer M2 and the data signal wiring 22DQ of the wiring layer M3 in the thickness direction. Further, since the data signal wiring 22DQ of the wiring layer M2 and the data signal wiring 22DQ of the wiring layer M3 overlap each other in the thickness direction in the case of the interposer 20F, it is possible to increase the number of the data signal wirings 22DQ as compared to the interposer 20C illustrated in FIG. 16.

<Manufacturing Method of Semiconductor Device>

Figure 20:
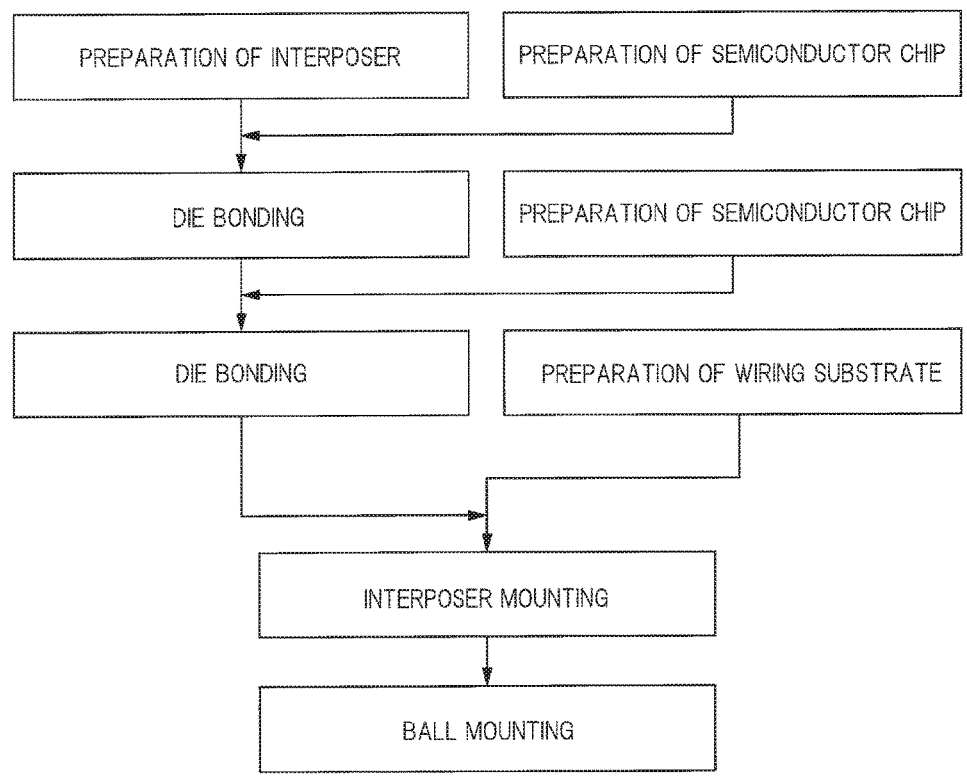
FIG. 20 is an explanatory diagram illustrating an overview of a manufacturing process of the semiconductor device described with reference to FIGS. 1 to 19.

Next, a manufacturing process of the semiconductor devices PKG1, PKG2, PKG3, PKG4 and PKG5 which have been described with reference to FIGS. 1 to 19 will be described. However, the above-described semiconductor devices PKG1, PKG2, PKG3, PKG4 and PKG5 are manufactured by the same manufacturing method except for a process of stacking the wiring layers in the interposer. Accordingly, a manufacturing method of the semiconductor device PKG1 will be described hereinafter as a representative example. In addition, the following description will be given with reference to a flowchart illustrating a flow of the manufacturing process and FIGS. 1 to 19 as needed. FIG. 20 is an explanatory diagram illustrating an overview of the manufacturing process of the semiconductor device that has been described with reference to FIGS. 1 to 19.

<Preparation of Interposer>

First, the interposer 20A illustrated in FIG. 10, the interposer 20B illustrated in FIG. 15, the interposer 20C illustrated in FIG. 16, the interposer 20D illustrated in FIG. 18, or the interposer 20E illustrated in FIG. 19 is prepared in an interposer preparing process. In the manufacturing method of the interposers 20A, 20B, 20C, 20D and 20E (hereinafter, described as the interposer 20A as a representative in the description of the manufacturing process), the silicon substrate 21 as a semiconductor wafer is prepared, and the plurality of wiring layers are stacked on the silicon substrate 21. For example, as a method of stacking the wiring layers, the insulating layer depositing process, the conductor embedding process, and the polishing process are repeatedly performed as described above.

In this process, the plurality of interposers 20A are collectively formed on the single semiconductor wafer. Further, after the wiring layers are stacked and subjected to an electrical test, the semiconductor wafer is cut along the dicing lines, thereby acquiring the plurality of interposers 20A.

<Die Bonding>

Next, the plurality of semiconductor chips 30 are mounted on the interposer 20A as illustrated in FIG. 3 in a die bonding process. In this process, the plurality of semiconductor chips 30 are mounted in order such that the front surfaces 30t of the plurality of semiconductor chips 30 and the top surface 20t of the interposer 20A face each other. Although the mounting order is not particularly limited, it is preferable to mount the semiconductor chip 30 having a relatively small thickness first when there is a difference in thickness among the plurality of semiconductor chips 30.

For example, although one memory chip 30A is provided in the present embodiment, a stacked body in which a plurality of memory chips 30A are stacked may be used as the memory chip 30A. In this case, since the thickness of the stacked body of the memory chips 30A is likely to be larger than that of the logic chip 30B, it is preferable to mount the logic chip 30B first.

In addition, the plurality of electrodes 33 of the semiconductor chip 30 and the plurality of surface electrodes 25 of the interposer 20A are electrically connected to each other via the plurality of bump electrodes 35 in this process as illustrated in FIG. 6.

Note that, although the plurality of bump electrodes 35 are exposed in FIGS. 3, 5 and 6, an underfill resin (not illustrated) maybe arranged between the semiconductor chip 30 and the interposer 20A so as to cover the periphery of the plurality of bump electrodes 35. The underfill resin is an insulating resin and can protect the bump electrodes 35 by covering the periphery of the plurality of bump electrodes 35.

<Interposer Mounting>

Next, the wiring substrate 10 which is a package substrate is prepared and the interposer 20A on which the plurality of semiconductor chips 30 have been mounted is mounted on the wiring substrate 10 as illustrated in FIG. 3 in an interposer mounting process. In this process, the interposer 20A is mounted such that the bottom surface 20b of the interposer 20A and the top surface 10t of the wiring substrate 10 face each other.

In addition, the plurality of rear surface electrodes of the interposer 20A and the plurality of bonding pads 16 of the wiring substrate 10 are electrically connected to each other via the bump electrodes 28 in this process as illustrated in FIG. 6.

Note that, although the plurality of bump electrodes 28 are exposed in FIGS. 3, 5 and 6, an underfill resin (not illustrated) may be arranged between the interposer 20A and the wiring substrate 10 so as to cover the periphery of the plurality of bump electrodes 28. The underfill resin is an insulating resin and can protect the bump electrodes 28 by covering the periphery of the plurality of bump electrodes 28.

<Ball Mounting>

Next, the plurality of solder balls 11 serving as the external terminals are bonded to the plurality of lands 12 formed on the bottom surface 10b of the wiring substrate 10 as illustrated in FIG. 3 in a ball mounting process.

In this process, after the bottom surface 10b of the wiring substrate 10 is directed upward, the solder ball 11 is disposed on each of the plurality of lands 12 exposed on the bottom surface 10b of the wiring substrate 10. Thereafter, the plurality of solder balls 11 are heated to bond the plurality of solder balls 11 to the lands 12. Through this process, the plurality of solder balls 11 are electrically connected to the plurality of semiconductor chips 30 (logic chip 30B and memory chip 30A) via the wiring substrate 10. However, the application of the technique described in the present embodiment is not limited to the so-called BGA (Ball Grid Array) type semiconductor device in which the solder balls 11 are bonded in an array form. For example, as a modification example with respect to the present embodiment, the technique can be applied to the so-called LGA (Land Grid Array) type semiconductor device which is shipped in a state where the lands 12 are exposed without forming the solder balls 11 or a state where the lands 12 are coated with a solder paste that is thinner than the solder balls 11. The ball mounting process can be omitted in the case of the LGA type semiconductor device.

(Second Embodiment)

In the above-described embodiment, a mode in which the silicon interposer in which the plurality of wiring layers are formed on the silicon substrate 21 is used as the interposer has been described. As described in the first embodiment above, the silicon interposer has an advantage that it is easy to improve the wiring density because it is possible to use the process similar to the process of forming the wirings on the semiconductor wafer.

In recent years, however, a technique of thinning a multilayer resin substrate in which a plurality of wiring layers are stacked via an organic insulating layer has progressed, and a wiring width and a thickness of a wiring layer or a thickness of an interlayer insulating film equivalent to those of the silicon interposer have been increasingly realized even in the multilayer resin substrate. Thus, a mode in which the technique that has been described in the first embodiment is applied to the multilayer resin substrate will be described in the present embodiment.

FIG. 21 is an enlarged cross-sectional view of a semiconductor device which is a modification example with respect to FIG. 6. In addition, FIG. 22 is a cross-sectional view of a principal part illustrating a modification example with respect to FIG. 10 and an example of an arrangement ratio for each type of transmission targets in each wiring layer of the interposer illustrated in FIG. 21.

A semiconductor device PKG7 illustrated in FIG. 21 is different from the semiconductor device PKG1 illustrated in FIG. 6 in terms of a structure of an interposer 20G. To be specific, the interposer 20G is different from the interposer 20A illustrated in FIG. 6 in terms that an insulating layer covering each of the plurality of wiring layers is an organic insulating layer 29.

In addition, the interposer 20G does not include the silicon substrate 21 illustrated in FIG. 6, and the bottom surface 20b of the interposer 20G is covered by the insulating film 17 which is an organic insulating film referred to as a solder resist film. Further, a plurality of openings are formed in the insulating film 17, and a part of the rear surface electrode 27 is exposed in the opening. Similarly, the top surface 20t of the interposer 20G is covered by the insulating film 17, and each part of the plurality of surface electrodes 25 is exposed in the plurality of openings formed in the insulating film 17.

Also, in the interposer 20G, for example, a wiring layer M0 of the lowermost layer, the wiring layer M1, the wiring layer M2, the wiring layer M3, and the wiring layer M4 of the uppermost layer are stacked in order from the top surface 10t of the wiring substrate 10. The plurality of rear surface electrodes 27 are formed in the wiring layer M0 of the lowermost layer, and the plurality of surface electrodes 25 are formed in the wiring layer M4 of the uppermost layer.

The interposer 20G is the same as the interposer 20A illustrated in FIG. 6 described in the first embodiment except for the above-described difference.

Since the interposer 20G according to the present embodiment does not include the silicon substrate 21 illustrated in FIG. 6, the problem described in the first embodiment that a part of the energy of the signal current is converted into the heat energy in the silicon substrate 21 and is consumed and the signal loss is caused does not occur.

However, when the signal is transmitted between the plurality of semiconductor chips 30 via the interposer 20G, it is preferable to shorten the return current path formed in the interposer 20G. In other words, it is preferable that the return current path which connects the semiconductor chips 30 to each other is provided at a position close to the semiconductor chip 30. As described in the first embodiment, for example, the ground potential is supplied to the reference potential line VS2 for reference illustrated in FIG. 4, and the reference potential line VS2 functions also as the return current path of the data signal transmitted through the data line DQ at the same time.

When the reference potential wiring 22VS illustrated in FIG. 22 constitutes a part of the reference potential line VS2 serving as the return current path, it is possible to shorten a path length of the return current by providing the reference potential wiring 22VS at the position close to the semiconductor chip 30 illustrated in FIG. 21.

Here, the interposer 20G has the following wiring structure in the region 22A sandwiched between the neighboring semiconductor chips 30. That is, the reference potential wiring 22VS constituting the return current path is mainly formed in the wiring layer M3, which is close to the wiring layer M4 in which the surface electrode 25 is formed, in the region 22A (see FIG. 21) as illustrated in FIG. 22.

To be specific, in the region 22A (see FIG. 21), a ratio (occupancy rate) of the reference potential wiring 22VS, which is constituting apart of a transmission path of a reference potential, in the plurality of wirings 22 in the wiring layer M3 is higher than a ratio (occupancy rate) of the reference potential wiring 22VS in the wiring layer M1. In addition, in the region 22A (see FIG. 9), a ratio (occupancy rate) of the signal wirings (the data signal wiring 22DQ and the control signal wiring 22CMD), which is constituting a part of the signal transmission path, in the plurality of wirings 22 in the wiring layer M1 is higher than a ratio (occupancy rate) of the signal wiring in the wiring layer M3.

In addition, the following wiring structure is provided in the example illustrated in FIG. 22. That is, in the interposer 20G, the ratio of the reference potential wiring (reference potential conductor) 22VS, which is constituting a part of the transmission path of the reference potential, in the plurality of wirings (conductor patterns) 22 arranged in the wiring layer M1 is lower than the ratio of the signal wiring (signal conductor), which is constituting apart of the signal transmission path. Also, the ratio of the reference potential wiring 22VS, which is constituting apart of the transmission path of the reference potential, in the plurality of wirings 22 arranged in the wiring layer M3 is higher than the ratio of the signal wiring, which is constituting a part of the signal transmission path.

In the interposer 20G according to the present embodiment, the return current path is provided in the wiring layer M3 close to the wiring layer M4 in which the surface electrode 25 is formed as described above, and thus a path length of a return current can be shortened as compared to the interposer 20H illustrated in FIG. 11.

In addition, in the example illustrated in FIG. 22, the data signal wiring 22DQ which performs the transmission at the high frequency band F2 (see FIG. 7) is mainly formed in the wiring layer M2 closer to the surface electrode 25 than the wiring layer M1. In other words, a ratio of the control signal wiring 22CMD through which the signal (control signal) is transmitted at a first frequency band (for example, the frequency band F1) in the plurality of signal wirings arranged in the wiring layer M2 is lower than a ratio of the data signal wiring 22DQ through which the signal (data signal) is transmitted at a second frequency band (for example, the frequency band F2). In addition, a ratio of the control signal wiring 22CMD through which the signal (control signal) is transmitted at the first frequency band (for example, the frequency band F1) in the plurality of signal wirings (conductor patterns) arranged in the wiring layer M1 is higher than a ratio of the data signal wiring 22DQ through which the signal (data signal) is transmitted at the second frequency band (for example, the frequency band F2), which is higher than the first frequency band. Thus, it is possible to shorten the transmission distance of the high frequency signal.

Note that the modification example with respect to the interposer 20A described in the first embodiment has been described while focusing on the difference. However, it is also possible to apply each of the first modification example and the second modification example described in the first embodiment and the structure the semiconductor device PKG7 according to the second embodiment in combination. Hereinafter, a mode in the case of combining a relay substrate including the organic insulating layer 29 (see FIG. 21) like in the second embodiment and the techniques described in the respective modification examples of the above-described embodiment will be described by way of example. For example, an interposer 20J included in a semiconductor device PKG8 illustrated in FIG. 23 is the relay substrate obtained by combining the wiring structure of the interposer 20F described with reference to FIG. 19 and the wiring structure of the interposer 20G described with reference to FIG. 22.

The interposer 20J is different from the interposer 20G illustrated in FIG. 22 in terms that the reference potential wiring 22VS is formed in the wiring layer M4. Thus, the interposer 20J can increase the number of wirings of the data signal wiring 22DQ as compared to the interposer 20G.

In addition, since the interposer 20J includes the reference potential wiring 22VS in the wiring layer M4 of the uppermost layer, the reference potential wiring 22VS of the wiring layer M4 can be formed in a sheet shape as described with reference to FIG. 14. In this case, the reference potential wiring 22VS can be used to function as a shield layer of an electromagnetic field.

In addition, the interposer 20J included in the semiconductor device PKG8 is different from the interposer 20G illustrated in FIG. 22 in terms that the separation distance B23 between the wiring layer M3 and the wiring layer M2 is larger than the separation distance B12 between the wiring layer M2 and the wiring layer M1. Also, in the example illustrated in FIG. 23, the separation distance B34 between the wiring layer M4 and the wiring layer M3 is still larger than the separation distance B23 between the wiring layer M3 and the wiring layer M2.

Thus, a characteristic impedance in a wiring path using the data signal wiring 22DQ and in a wiring path using the reference potential wiring 22VS for reference can be easily approximated to a predetermined value in the interposer 20J as compared to the interposer 20G illustrated in FIG. 22.

Other than the above-described combination, the relay substrate described in the present embodiment can be combined with each of the techniques described as the modification examples in the above-described embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the relay substrate, which has the four-layer structure in which the wiring layer M1, the wiring layer M2, the wiring layer M3, and the wiring layer M4 are stacked on the main surface 21t of the silicon substrate 21 as illustrated in FIG. 10, is taken as an example in the description of the first embodiment. In addition, the relay substrate, which has the five-layer structure in which the wiring layer M0 of the lowermost layer, the wiring layer M1, the wiring layer M2, the wiring layer M3, and the wiring layer M4 are stacked in order from the top surface 10t of the wiring substrate 10 as illustrated in FIG. 21, is taken as an example in the description of the second embodiment. However, the technique described in the first embodiment and the second embodiment in which the reference potential wiring 22VS is mainly provided in the wiring layer on the side relatively close to the semiconductor chip 30 and the signal wiring is mainly provided in the lower wiring layer can be applied to various relay substrates without any limitations on the number of the wiring layers.

For example, the technique can be applied to a relay substrate which includes two wiring layers between the wiring layer M4 in which the surface electrode 25 is formed and the silicon substrate 21 (or the wiring layer M0 illustrated in FIG. 21). In this case, the wiring layers for three layers can be secured by providing the reference potential wiring 22VS mainly in the wiring layer M4.

In addition, the technique can be applied to a relay substrate which includes four or more wiring layers between the wiring layer M4 in which the surface electrode 25 is formed and the silicon substrate 21 (or the wiring layer M0 illustrated in FIG. 21). In this case, since a space in which the data signal wiring 22DQ can be arranged further increases, it is possible to increase the number of the data lines DQ illustrated in FIG. 4.

Further, the technique can be applied to a relay substrate which includes one wiring layer between the wiring layer M4 in which the surface electrode 25 is formed and the silicon substrate 21 (or the wiring layer M0 illustrated in FIG. 21). In this case, a reference potential wiring may be provided in a wiring layer of the uppermost layer, and a plurality of signal wirings including the data signal wiring 22DQ may be provided in a wiring layer of the lowermost layer. However, it is preferable to provide a large separation distance between the main surface 21t of the silicon substrate 21 and a wiring layer closest to the main surface 21t in the case of using the silicon substrate 21.

Also, a mode in which only the interposer is mounted on the wiring substrate 10 has been described for the simplicity in the above-described embodiments and the respective modification examples. However, it does not matter if semiconductor components and electronic components other than the interposer are mounted on the wiring substrate 10.

In addition, the example in which the one logic chip 30B and the one memory chip 30A are mounted on the interposer has been described in the above-described embodiments and the respective modification examples. However, it does not matter if three or more semiconductor chips 30 are mounted on the interposer. With respect to the memory chip 30A, for example, there is a technique of increasing a storage capacity by stacking a plurality of the memory chips 30A. Accordingly, the memory chip 30A described in the above-described embodiments and the like may be a stacked body of the plurality of memory chips.

In addition, since it is enough if the neighboring semiconductor chips 30 mounted on the interposer are connected to each other via the wiring layer of the interposer, the plurality of semiconductor chips 30 are not necessarily the memory chip 30A and the logic chip 30B. For example, the plurality of semiconductor chips 30 may be a sensor chip in which a sensor circuit is formed and a controller chip in which a control circuit that controls the sensor circuit is formed.

Further, the data line DQ (see FIG. 4) described as the transmission path of the data signal in the above-described embodiments and the respective modification examples is a signal transmission path having a so-called single-end structure. As a modification example, however, the data line may be a transmission path of a differential signal which uses two signal transmission paths forming a pair.

In addition, it is possible to apply the modification examples in combination within the range of the gist of the technical idea described in the embodiments above.

Furthermore, some of the contents described in the embodiments will be described below.

(1)

A semiconductor device including:

a wiring substrate;

an interposer mounted on a first surface of the wiring substrate;

a first semiconductor component mounted on the interposer;

a second semiconductor component mounted on the interposer, and controlling the first semiconductor component, the first semiconductor component and the second semiconductor component being arranged next to each other; and a plurality of external terminals formed on a second surface of the wiring substrate, which is opposite to the first surface, wherein the interposer includes a plurality of wiring layers, wherein the first semiconductor component and the second semiconductor component are electrically connected to each other via the plurality of wiring layers, wherein the plurality of wiring layers include a first wiring layer, a second wiring layer spaced farther away from the first surface of the wiring substrate than the first wiring layer, and a third wiring layer spaced farther away from the first surface than the second wiring layer, wherein a ratio of a reference potential wiring, which is constituting a part of a transmission path of a reference potential, in a plurality of wirings arranged in the first wiring layer is lower than a ratio of a signal wiring, which is constituting a part of a signal transmission path, and wherein a ratio of the reference potential wiring in a plurality of wirings arranged in the third wiring layer is higher than a ratio of the signal wiring.

(2)

A semiconductor device including:

a wiring substrate;

an interposer mounted on a first surface of the wiring substrate;

a first semiconductor component mounted on the interposer;

a second semiconductor component mounted on the interposer, and controlling the first semiconductor component, the first semiconductor component and the second semiconductor component being arranged next to each other; and a plurality of external terminals formed on a second surface of the wiring substrate, which is opposite to the first surface, wherein the interposer includes a base member made of a semiconductor material as a base material and a plurality of wiring layers arranged on a main surface of the base member, wherein the first semiconductor component and the second semiconductor component are electrically connected to each other via the plurality of wiring layers, wherein the plurality of wiring layers include a first wiring layer and a second wiring layer spaced farther away from the main surface of the base member than the first wiring layer, wherein, in a first region of the interposer which is sandwiched between the first semiconductor component and the second semiconductor component and also in plan view, a ratio of a reference potential wiring, which is constituting a part of a transmission path of a reference potential, in the second wiring layer is higher than a ratio of the reference potential wiring in the first wiring layer, and wherein, in the first region of the interposer and also in plan view, a ratio of a signal wiring, which is constituting a part of a signal transmission path, in the first wiring layer is higher than a ratio of the signal wiring in the second wiring layer.

(3)

A semiconductor device including:

a wiring substrate;

an interposer mounted on a first surface of the wiring substrate;

a first semiconductor component mounted on the interposer;

a second semiconductor component mounted on the interposer, and controlling the first semiconductor component, the first semiconductor component and the second semiconductor component being arranged next to each other; and a plurality of external terminals formed on a second surface of the wiring substrate, which is opposite to the first surface, wherein the interposer includes a base member made of a semiconductor material as a base material and a plurality of wiring layers arranged on a main surface of the base member, wherein the first semiconductor component and the second semiconductor component are electrically connected to each other via the plurality of wiring layers, wherein the plurality of wiring layers include a first wiring layer and a second wiring layer spaced farther away from the main surface of the base member than the first wiring layer, wherein, in a first region of the interposer which is sandwiched between the first semiconductor component and the second semiconductor component and also in plan view, a ratio of a reference potential wiring, which is constituting a part of a transmission path of a reference potential, in a plurality of wirings arranged in the first wiring layer is lower than a ratio of a signal wiring, which is constituting a part of a signal transmission path, and wherein, in the first region of the interposer and also in plan view, a ratio of the reference potential wiring in a plurality of wirings arranged in the second wiring layer is higher than a ratio of the signal wiring.

REFERENCE SIGNS LIST 10 wiring substrate (package substrate)
10b bottom surface (surface, mounting surface)
10s side surface
10t top surface (surface, chip mounting surface)
11 solder ball (external terminal, electrode, external electrode)
12 land (external terminal, electrode, external electrode, terminal, solder connection pad)
13 wiring
14 insulating layer
15 via wiring
16 bonding pad (terminal, chip mounting surface terminal, electrode)
17 insulating film
20A, 20B, 20C, 20D, 20E, 20F, 20G, 20H, 20J interposer (relay substrate)
20b bottom surface (surface, mounting surface)

20s side surface
20t top surface (surface, chip mounting surface)
21 silicon substrate (base member)
21t main surface
22 wiring (conductor pattern)
22A, 22B region
22CMD control signal wiring
22DQ data signal wiring
22VS reference potential wiring (reference potential conductor)
23 insulating layer
24 through electrode
25, 25A, 25B surface electrode (electrode pad, terminal)
27 passivation film
27 rear surface electrode (electrode, pad, terminal)
28 bump electrode
29 organic insulating layer
30 semiconductor chip (semiconductor component)
30A memory chip
30b rear surface (main surface, bottom surface)
30B logic chip
30s side surface
30t front surface (main surface, top surface)
31 silicon substrate (base member)
31t main surface
32 wiring layer
33, 33A, 33B electrode (surface electrode, pad, terminal)
34 passivation film
35 bump electrode
40 external device
50 power supply
60 mounting substrate
B12, B23, B34 separation distance
CF current
CMD control signal line (signal line)
CORE1, CORE2 core circuit (main circuit)
D1, D2 diameter
DQ data line (signal line)
DRV1, DRV2 power supply circuit (drive circuit)
F1, F2 frequency band
IF1 external interface circuit (input and output circuit, external input and output circuit)
IF2 internal interface circuit (input and output circuit, internal input and output circuit)
M0, M1, M2, M3, M4 wiring layer
P1, P2 separation distance
PKG1, PKG2, PKG3, PKG4, PKG5, PKG6, PKG7, PKG8 semiconductor device
SIG signal line
VD1, VD2, VD3 power supply line
VS1, VS2 reference potential line

The invention claimed is:

1. A semiconductor device comprising:
a wiring substrate;
an interposer mounted on a first surface of the wiring substrate;
a first semiconductor component mounted on the interposer;
a second semiconductor component mounted on the interposer, and controlling the first semiconductor component, the first semiconductor component and the second semiconductor component being arranged next to each other; and
a plurality of external terminals formed on a second surface of the wiring substrate, which is opposite to the first surface,
wherein the interposer includes a base member made of a semiconductor material as a base material and a plurality of wiring layers arranged on a main surface of the base member,
wherein the first semiconductor component and the second semiconductor component are electrically connected to each other via the plurality of wiring layers,
wherein the plurality of wiring layers include a first wiring layer, a second wiring layer spaced farther away from the main surface of the base member than the first wiring layer, and a third wiring layer spaced farther away from the main surface of the base member than the second wiring layer,
wherein, in a first region of the interposer which is sandwiched between the first semiconductor component and the second semiconductor component and also in plan view, a ratio of reference potential wirings, which constitute a part of a transmission path of a reference potential, in the third wiring layer is higher than a ratio of the reference potential wirings in the first wiring layer, and
wherein, in the first region of the interposer and also in plan view, a ratio of signal wirings, which constitute a part of a signal transmission path, in the first wiring layer is higher than a ratio of the signal wirings in the third wiring layer.

2. The semiconductor device according to claim 1,
wherein the base member contains an impurity element constituting a conductive characteristic of a first conductivity type or a second conductivity type opposite to the first conductivity type.

3. The semiconductor device according to claim 2,
wherein the signal wirings include first signal wirings through which a first signal is transmitted at a first frequency band and second signal wirings through which a second signal is transmitted at a second frequency band higher than the first frequency band,
wherein, in the first region of the interposer which is sandwiched between the first semiconductor component and the second semiconductor component and also in plan view, a ratio of the first signal wirings the signal wirings arranged in the first wiring layer is higher than a ratio of the second signal wirings, and
wherein, in the first region of the interposer and also in plan view, a ratio of the first signal wirings the signal wirings arranged in the second wiring layer is lower than a ratio of the second signal wirings.

4. The semiconductor device according to claim 3,
wherein the second signal wirings are not formed in the first wiring layer.

5. The semiconductor device according to claim 3,
wherein a separation distance between the third wiring layer and the second wiring layer is larger than a separation distance between the first wiring layer and the second wiring layer.

6. The semiconductor device according to claim 5,
wherein the plurality of wiring layers of the interposer further include an uppermost wiring layer which is spaced farther away from the main surface of the base member than the third wiring layer and in which a plurality of first electrode pads are formed, and
wherein a separation distance between the uppermost wiring layer and the third wiring layer is larger than the separation distance between the third wiring layer and the second wiring layer.

7. The semiconductor device according to claim 2,
wherein a plurality of first electrode pads are formed in the third wiring layer of the interposer, and
wherein the plurality of first electrode pads are electrically connected to the first semiconductor component or the second semiconductor component via a plurality of bump electrodes.

8. The semiconductor device according to claim 7,
wherein first electrode pads for a reference potential, which constitute a part of the transmission path of the reference potential, in the plurality of first electrode pads formed in the third wiring layer of the interposer are connected to be formed in a sheet shape.

9. The semiconductor device according to claim 1,
wherein a separation distance between the plurality of wiring layers of the interposer and a separation distance between the first wiring layer and the main surface of the base member are smaller than each thickness of the plurality of wiring layers.

10. The semiconductor device according to claim 1,
wherein a separation distance between the third wiring layer and the second wiring layer is larger than a separation distance between the second wiring layer and the first wiring layer.

11. The semiconductor device according to claim 3,
wherein the first semiconductor component includes a first circuit,
wherein the second semiconductor component includes a second circuit that controls an operation of the first circuit of the first semiconductor component, and
wherein the first semiconductor component and the second semiconductor component are electrically connected to each other via the first signal wirings, the second signal wirings, and the reference potential wirings.

12. The semiconductor device according to claim 11,
wherein the first signal wirings and the second signal wirings are electrically isolated from the wiring substrate, and the reference potential wirings are electrically connected to the wiring substrate.

13. The semiconductor device according to claim 2,
wherein the plurality of wiring layers of the interposer further include an uppermost wiring layer which is spaced farther away from the main surface of the base member than the third wiring layer and in which a plurality of first electrode pads are formed, and
wherein the reference potential wirings formed in the third wiring layer have a mesh shape in plan view.

14. The semiconductor device according to claim 2,
wherein the plurality of wiring layers of the interposer further include an uppermost wiring layer which is spaced farther away from the main surface of the base member than the third wiring layer and in which a plurality of first electrode pads are formed, and
wherein a separation distance between the uppermost wiring layer and the third wiring layer is larger than a separation distance between the third wiring layer and the second wiring layer.

15. The semiconductor device according to claim 1,
wherein the plurality of wiring layers of the interposer further include an uppermost wiring layer which is spaced farther away from the main surface of the base member than the third wiring layer and in which a plurality of first electrode pads are formed, and
wherein a wiring is not formed in the uppermost wiring layer in the first region.

16. A semiconductor device comprising:
a wiring substrate;
an interposer mounted on a first surface of the wiring substrate;
a first semiconductor component mounted on the interposer;
a second semiconductor component mounted on the interposer, and controlling the first semiconductor component, the first semiconductor component and the second semiconductor component being arranged next to each other; and
a plurality of external terminals formed on a second surface of the wiring substrate, which is opposite to the first surface,
wherein the interposer includes a base member made of a semiconductor material as a base material and a plurality of wiring layers arranged on a main surface of the base member,
wherein the first semiconductor component and the second semiconductor component are electrically connected to each other via the plurality of wiring layers,
wherein the plurality of wiring layers include a first wiring layer, a second wiring layer spaced farther away from the main surface of the base member than the first wiring layer, and a third wiring layer spaced farther away from the main surface of the base member than the second wiring layer,
wherein, in a first region of the interposer which is sandwiched between the first semiconductor component and the second semiconductor component and also in plan view, a ratio of a reference potential wirings, which constitute a part of a transmission path of a reference potential, in a plurality of wirings arranged in the first wiring layer is lower than a ratio of a signal wirings, which constitute a part of a signal transmission path, and
wherein, in the first region of the interposer and also in plan view, a ratio of the reference potential wirings in a plurality of wirings arranged in the third wiring layer is higher than a ratio of the signal wirings.

17. The semiconductor device according to claim 16,
wherein the base member contains an impurity element constituting a conductive characteristic of a first conductivity type or a second conductivity type opposite to the first conductivity type.

18. The semiconductor device according to claim 17,
wherein the signal wirings include first signal wirings through which a first signal is transmitted at a first frequency band and second signal wirings through which a second signal is transmitted at a second frequency band higher than the first frequency band,
wherein, in the first region of the interposer which is sandwiched between the first semiconductor component and the second semiconductor component and also in plan view, a ratio of the first signal wirings in the signal wirings arranged in the first wiring layer is higher than a ratio of the second signal wirings, and
wherein, in the first region of the interposer and also in plan view, a ratio of the first signal wirings in the signal wirings arranged in the second wiring layer is lower than a ratio of the second signal wirings.

19. A semiconductor device comprising:
a wiring substrate;
an interposer mounted on a first surface of the wiring substrate;
a first semiconductor component mounted on the interposer;

a second semiconductor component mounted on the interposer, and controlling the first semiconductor component, the first semiconductor component and the second semiconductor component being arranged next to each other; and a plurality of external terminals formed on a second surface of the wiring substrate, which is opposite to the first surface, wherein the interposer includes a plurality of wiring layers, wherein the first semiconductor component and the second semiconductor component are electrically connected to each other via the plurality of wiring layers, wherein the plurality of wiring layers include a first wiring layer, a second wiring layer spaced farther away from the first surface of the wiring substrate than the first wiring layer, and a third wiring layer spaced farther away from the first surface than the second wiring layer, wherein, in a first region of the interposer which is sandwiched between the first semiconductor component and the second semiconductor component and also in plan view, a ratio of a reference potential wirings, which constitutes a part of a transmission path of a reference potential, in the third wiring layer is higher than a ratio of the reference potential wirings in the first wiring layer, and wherein, in the first region of the interposer and also in plan view, a ratio of a signal wirings, which constitutes a part of a signal transmission path, in the first wiring layer is higher than a ratio of the signal wirings in the third wiring layer.

20. The semiconductor device according to claim 19, wherein a separation distance between the third wiring layer and the second wiring layer is larger than a separation distance between the second wiring layer and the first wiring layer.

* * * * *